United States Patent [19]
Crozier et al.

[11] Patent Number: 6,140,900
[45] Date of Patent: Oct. 31, 2000

[54] ASSYMETRIC SUPERCONDUCTING MAGNETS FOR MAGNETIC RESONANCE IMAGING

[75] Inventors: Stuart Crozier; David M. Doddrell; Huawei Zhao, all of Brisbane, Australia

[73] Assignee: The University of Queensland, Brisbane, Australia

[21] Appl. No.: 09/421,035

[22] Filed: Oct. 20, 1999

[30] Foreign Application Priority Data

Aug. 3, 1999 [AU] Australia .................................. PQ1988

[51] Int. Cl.[7] .................................. G01V 3/00; H01F 5/00
[52] U.S. Cl. .......................................... 335/299; 324/319
[58] Field of Search ..................................... 335/216, 296, 335/299, 301; 324/318, 319, 320

[56] References Cited

U.S. PATENT DOCUMENTS

| | | |
|---|---|---|
| 4,689,591 | 8/1987 | McDougall . |
| 4,701,736 | 10/1987 | McDougall et al. . |
| 5,084,677 | 1/1992 | McDougall ............................ 324/320 |
| 5,416,415 | 5/1995 | Dorri et al. . |
| 5,428,292 | 6/1995 | Dorri et al. . |
| 5,596,303 | 1/1997 | Akgun et al. ........................... 335/216 |
| 5,717,333 | 2/1998 | Frese et al. ............................. 324/319 |
| 5,814,993 | 9/1998 | Frese et al. ............................. 324/319 |
| 5,818,319 | 10/1998 | Crozier et al. . |

FOREIGN PATENT DOCUMENTS

WO 94/06034  3/1994  WIPO .

OTHER PUBLICATIONS

Brown, et al., "New applications of inverse methods in the design of MRI coils", *Int. J. of Applied Electromagnetics and Mechanics*, 9:277–290, (1998).

Crozier et al., "Compact MRI magnet design by stochastic optimization," *J. Magn. Reson.*, 127:233–237 (1997).

Davies, et al., "A 2-Tesla active shield magnet for whole body imaging and spectroscopy," *IEEE Trans. Magn.*, 27:1677–1680, (1991).

Forbes, et al.,"Rapid Computation of Static Fields produced by thick circular solenoids" *IEEE Trans. Magn.* 33:4405–4410 (1997).

Garrett, M. W., "Axially symmetric systems for generating and measuring magnetic fields. Part I," *J. Appl. Phys.*, 22:1091–1107 (1951).

Garrett, M. W., "Thick cylindrical coil systems for strong magnetic fields with field or gradient homogeneities of the $6^{th}$ to $20^{th}$ order," *J. Appl. Phys.*, 38:2563–2586 (1967).

Kalafala, A.K., "Optimized configurations for actively shielded magnetic resonance imaging magnets," *IEEE Trans. Magn.*, 27:1696–1699 (1991).

Mansfield et al., *NMR in Imaging and Biomedicine*, Academic Press, Orlando, Fla., 1982.

(List continued on next page.)

*Primary Examiner*—Lincoln Donovan
*Assistant Examiner*—Raymond Barrera
*Attorney, Agent, or Firm*—Maurice M. Klee

[57] ABSTRACT

Asymmetric, compact superconducting magnets for magnetic resonance imaging are provided. The magnets have a homogeneous region (the "dsv") which can be located close to one end of the magnet so as to reduce the sensation of claustrophobia experienced by patients undergoing MRI procedures. The magnets can be designed using a hybrid process in which current density analysis is performed to obtain an initial coil configuration which is then refined using non-linear optimization techniques to obtain a final coil configuration. The hybrid method can incorporate various constraints, including, the location and size of the dsv, the uniformity and strength of the $B_0$ field, stray field strengths outside of the superconducting magnet, and field strengths within the magnet's coils. The hybrid technique can also be used to design compact symmetric superconducting magnets.

20 Claims, 24 Drawing Sheets

OTHER PUBLICATIONS

Phillips, D. L., "A technique for the numerical solution of certain integral equation of the first kind," *J. Assoc. Comp. Mech.*, 9:84–97 (1962).

Pissanetzky, S., "Structured coil for NMR applications," *IEEE Trans. Magn.*, 28:1961–1968 (1992).

Press et al., "Numerical Recipes in C", Cambridge University Press, (1992), 683–688.

Schmidt et al,. "A 4 Tesla/ 1 meter superferric MRI magnet," *IEEE Trans. Magn.*, 27:1681–1684 (1991).

Siebold, H., "Design optimization of main, gradient and RF field coils for MR imaging," *IEEE Trans. Magn.*, 26:841–846 (1990).

Thompson et al., "An inverse approach to design of MRI main magnets", *IEEE Trans. Magn.*, 30:108–112, (1994).

Twomey, S., "On the numerical solution of Fredholm integral equations of the first kind by the inversion of the linear system produced by quadrature," *J. Assoc. Comp. Mech.*, 10, 97–101 (1963).

ASSYMETRIC SUPERCONDUCTING MAGNETS FOR MAGNETIC RESONANCE IMAGING

FIELD OF THE INVENTION

This invention relates to a method of magnet design and magnet configurations produced by the method. In particular, the invention relates to asymmetric superconducting magnets for magnetic resonance imaging (MR imaging) and methods for designing such magnets.

BACKGROUND OF THE INVENTION

The generation of strong and pure magnetic fields is of great interest in many technical applications. In particular, it is very important for clinical magnetic resonance imaging (MRI). A major specification of the static field in MRI is that it has to be substantially homogeneous over a predetermined region, known in the art as the "diameter spherical imaging volume" or "dsv." Errors less than 20 parts per million peak-to-peak (or 10 parts per million rms) over a dsv having a diameter of 45–50 cm are often required. Conventional medical MRI systems are typically around 1.6–2.0 m in length with free bore diameters in the range of 0.8–1.0 m. Normally, the magnet is symmetric and the midpoint of the dsv is located at the geometric center of the magnet's structure. The central uniformity of symmetrical fields is often analyzed by a zonal spherical harmonic expansion.

The basic components of a magnet system 10 useful for performing magnetic resonance investigations are shown in FIG. 14. The system of this figure is suitable for producing diagnostic images for human studies, similar systems being used for other applications.

System 10 includes magnet housing 12, superconducting magnet 13, shim coils 14, gradient coils 16, RF coils 18, and patient table 20. As is well known in the art, magnet 13 serves to produce a substantially uniform field (the $B_0$ field) in the dsv. Discussions of MRI, including magnet systems for use in conducting MRI studies, can be found in, for example, Mansfield et al., NMR in Imaging and Biomedicine, Academic Press, Orlando, Fla., 1982. See also McDougall, U.S. Pat. No. 4,689,591; McDougall et al., U.S. Pat. No. 4,701,736; Dorri et al., U.S. Pat. No. 5,416,415; Dorri et al., U.S. Pat. No. 5,428,292; and Chari et al., International Publication No. WO 94/06034.

In modern medical imaging, there is a distinct and long-felt need for magnet systems which have a shorter overall length. The typical patient aperture of a conventional MRI machine is a cylindrical space having a diameter of about 0.6–0.8 meters, i.e., just large enough to accept the patient's shoulders, and a length of about 2.0 meters or more. The patient's head and upper torso are normally located near the center of the patient aperture, which means that they are typically about a meter from the end of the magnet system.

Not surprisingly, many patients suffer from claustrophobia when placed in such a space. Also, the distance of the patient's head and torso from the end of the magnet system means that physicians cannot easily assist or personally monitor the patient during an MRI procedure, which can last as long as an hour or two.

In addition to its affects on the patient, the length of the magnet is a primary factor in determining the cost of an MRI machine, as well as the costs involved in the siting of such a machine. In order to be safely used, MRI machines often need to be shielded so that the magnetic fields surrounding the machine at the location of the operator are below FDA-specified exposure levels. By means of shielding, the operator can be safely sited much closer to the magnet than in an unshielded system. Longer magnets require more internal shielding and larger shielded rooms for such safe usage, thus leading to higher costs.

In recent years, there has been an increasing interest in the optimal design of clinical MRI magnets. See, for example, M. W. Garrett, "Axially symmetric systems for generating and measuring magnetic fields. Part I," J. Appl. Phys. 22, 1091–1107 (1951); M. W. Garrett, "Thick cylindrical coil systems for strong magnetic fields with field or gradient homogeneities of the $6^{th}$ to $20^{th}$ order," J. Appl. Phys. 38, 2563–2586 (1967); H. Siebold, "Design optimization of main, gradient and RF field coils for MR imaging," IEEE Trans. Magn. 26, 841–846 (1990); F. J. Davies, R. T. Elliott, and D. G. Hawkesworth, "A 2-Tesla active shield magnet for whole body imaging and spectroscopy," IEEE Trans. Magn. 27, 1677–1680 (1991); A. K. Kalafala, "Optimized configurations for actively shielded magnetic resonance imaging magnets," IEEE Trans. Magn. 27, 1696–1699 (1991); and W. M. Schmidt, R. R. Huson, W. W. Mackay, and R. M. Rocha, "A 4 Tesla/1 meter superferric MRI magnet," IEEE Trans. Magn. 27, 1681–1684 (1991).

In addition to the above work, Pissanetzky has proposed an approach to field design based on a hybridized methodology incorporating ideas from finite elements, analytical techniques, and other numerical methods. See S. Pissanetzky, "Structured coil for NMR applications," IEEE Trans. Magn., 28, 1961–1968 (1992). Thompson has illustrated a method based on a variational approach with constraints introduced by Lagrange multipliers. The analytical aspects of the variational calculus were combined with numerical techniques to obtain optimal spatial coil distributions. See Michael R. Thompson, Robert W. Brown, and Vishnu C. Srivastava, "An inverse approach to design of MRI main magnets", IEEE Trans. Magn., 30, 108–112, (1994); and Robert W. Brown, Hiroyukai Fujita, Shmaryu M. Shvartsman, Michael R. Thompson, Michael A. Morich, Labros S. Petropoulos, and Vishnu C. Srivastava, "New applications of inverse methods in the design of MRI coils", Int. J. of Applied Electromagnetics and Mechanics, 9, 277–290, (1998). Crozier has introduced a stochastic optimization technique that was successfully used to design symmetric, compact MRI magnets. See S. Crozier and D. M. Doddrell, "Compact MRI magnet design by stochastic optimization," J. Magn. Reson.127, 233–237 (1997); and U.S. Pat. No. 5,818,319.

In general, the design of superconducting MRI magnets requires the consideration of various parameters. These include: central magnetic field strength, peak field in the superconductors, spatial homogeneity within the dsv, geometrical constraints, weight, and cost. The challenge in designing a compact magnet is the retention of high homogeneity conditions in the dsv, as magnet homogeneity is strongly dependent on the overall length of the coil structure. A measure of this fact is the relaxation factor $\gamma=d/R$, (see FIG. 1a), where d is the distance from the end of the magnet to the beginning of the dsv on axis and R is the free bore radius. The smaller the value of $\gamma$, the more difficult it is to obtain a desired homogeneity level in the dsv.

SUMMARY OF THE INVENTION

In view of the foregoing, it is an object of the invention to provide high quality MR images and at the same time minimize the sense of claustrophobia experienced by patients and allow better access to patients by attending physicians.

More particularly, it is an object of the invention to provide MRI magnets which have a dsv diameter of at least 40 centimeters, a uniformity over the dsv of at least 20 ppm peak-to-peak, and a dsv location which is closer to one end of the magnet than the other, e.g., a dsv location where the midpoint M of the dsv is within 40 centimeters of an end of the magnet (see FIG. 1b).

It is also an object of the invention to provide methods of magnet design and magnet configurations produced by the methods which minimize the difficulties which have existed in the art in designing MRI magnets which have short lengths and/or offset dsv's.

To achieve the foregoing and other objects, the invention in accordance with certain of its aspects provides a magnetic resonance system for producing MR images comprising an asymmetric superconducting magnet which produces a magnetic field which is substantially homogeneous over a dsv having a diameter greater than or equal to 40 centimeters, said magnet having a longitudinal axis (e.g., the "z-axis") and comprising a plurality of current carrying coils which surround the axis, are distributed along the axis, and define a turn distribution function T(z) which varies with distance z along the axis and is equal to the sum of the number of turns in all coils at longitudinal position z, wherein:

(i) the longitudinal extent "L" of the plurality of coils (see FIG. 1b) defines first and second ends for the superconducting magnet, which, for example, can be spaced apart by a distance which is less than or equal to 1.4 meters and greater than or equal to 0.3 meters, (ii) the variation of the longitudinal component of the magnetic field in the dsv is less than 20 parts per million peak-to-peak, (iii) the dsv defines a midpoint "M" which is closer to the first end than to the second end, (iv) the midpoint "M" of the dsv is spaced from the first end by a distance "D" which is less than or equal to 40 centimeters (preferably, less than or equal to 35 centimeters), and (v) the turn distribution function T(z) has a maximum value which occurs at a longitudinal location that is closer to the first end than to the second end.

In accordance with the invention, it has been determined that to move a dsv towards one end of an MRI magnet (the "first end") and still retain a high level of uniformity of the $B_0$ field over the dsv, the turn distribution function must exhibit substantially larger values near said first end. Preferably, the maximum value of the turn distribution function T(z) occurs at the first end, although in some cases in can be displaced to some extent from that end.

The turn distribution function is calculated by summing the number of turns of all coils surrounding a particular longitudinal position regardless of the radial locations of the coils and regardless of the direction in which current flows through the coils (i.e., the turn distribution function is a count of the number of turns in all coils without regard to winding direction). The turn distribution function combines the effects of what would be referred to in classical MRI magnet design as primary and shielding coils, but does not include shim coils or gradient coils.

For the magnet designs of the invention, the terms "primary" and "shielding" coils are, in general, not particularly meaningful since the coils of the magnet take on a variety of radial locations, axial locations, and winding directions in order to achieve the desired dsv characteristics, as well as, desired overall magnet geometry (e.g., the magnitude of "L"), desired stray field levels external to the magnet (e.g., stray field levels less than $5 \times 10^{-4}$ Tesla at all locations greater than 6 meters from the midpoint M of the dsv), and desired peak field strengths within the coils of the magnet (e.g., a peak magnetic field strength within the current carrying coils of less than 8.5 Tesla). Put another way, the coil designs of the invention exhibit a richness in distribution which makes the simplistic primary/shielding terminology of the prior art inappropriate.

In certain preferred embodiments, the MRI magnet will have a plurality of radially-stacked coils at the first end which are wound to carry currents in opposite directions. For example, at least one of the radially-stacked coils can be wound so as to carry current in a first direction and at least two others of those coils can be wound so as to carry current in a second direction opposite to the first direction. In certain embodiments, these two coils are located radially adjacent to one another. In other embodiments, the radially innermost and radially outermost of the radially-stacked coils are wound to carry current in the same direction.

According to another aspect, the invention provides a method of designing magnets for use in magnetic resonance imaging comprising the steps of:

(1) determining one or more desired current densities for a specified total magnet length L, a specified dsv diameter, a specified dsv position within the magnet, and a specified $B_0$ field strength, (2) determining an initial coil configuration from a plot of the one or more current densities determined in step (1), and (3) optimizing the initial coil configuration to arrive at a final coil configuration for the magnet design.

More particularly, a method for designing a superconducting magnet having a longitudinal axis which lies along the z-axis of a three dimensional coordinate system is provided which comprises:

(a) selecting at least one cylindrical surface for current flow (e.g., 2 to 6 surfaces), said surface being located at a radius r1 from the longitudinal axis and having a preselected length L along said axis;

(b) selecting at least one constraint on the magnetic field produced by the superconducting magnet, said at least one constraint comprising the homogeneity of the magnetic field in the z-direction produced by the superconducting magnet over a predetermined region (the "dsv");

(c) obtaining a vector $J_{r1}(z)$ of current densities at the at least one cylindrical surface by solving the matrix equation:

$$AJ_{r1}(z)=B \qquad \text{(Equation I)}$$

where A is a matrix of unknown (non-linear) coefficients and B is a vector obtained by evaluating Biot-Savart integrals for each element of $J_{r1}(z)$ for the at least one constraint, said vector $J_{r1}(z)$ of current densities being obtained by:

(i) transforming Equation I into a functional that can be solved using a preselected regularization technique, and (ii) solving the functional using said regularization technique;

(d) selecting an initial set of coil geometries for the superconducting magnet using the vector $J_{r1}(z)$ of current densities obtained in step (c); and (e) determining final coil geometries for the superconducting magnet using a non-linear optimization technique applied to the initial set of coil geometries of step (d).

In the preferred embodiments of the invention, the selected at least one cylindrical surface for current flow has a first end and a second end, and step (b) in addition to requiring a specified homogeneity of the magnetic field in the z-direction over the dsv, also requires that:

(a) the dsv has a midpoint closer to the first end than to the second end; and/or (b) the magnitude of the stray magnet fields produced by the superconducting magnet at at least one location external to the superconducting magnet (e.g., along the surface of an ellipse external to the magnet) is less than a specified level; and/or (c) the peak magnetic field strength within the coils of the superconducting magnet is less than a specified level.

Preferably, all of constraints (a), (b), and (c) are simultaneously applied, along with the basic constraint that the magnetic field has a specified homogeneity in the z-direction over the dsv.

According to another aspect of the invention, magnet configurations suitable for use in MR imaging are produced by above method.

BRIEF DESCRIPTION OF THE DRAWINGS

The invention will be described by way of examples with reference to the drawings in which:

FIG. 10b is a perspective view of the coil configuration shown in FIG. 10a.

FIG. 12b is a plot showing field distribution and coil configuration for a magnet designed based on the current densities of FIG. 12a.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DESCRIPTION OF THE PREFERRED EMBODIMENTS

As discussed above the present invention relates to asymmetric MRI magnets and methods for designing such magnets. The design technique involves two basic steps: (1) use of a current density analysis to obtain a first estimate of coil locations, and (2) use of non-linear optimization to obtain a final coil configuration. For ease of presentation, the method aspects of the invention are discussed below in terms of a single current density layer, it being understood that the invention is equally applicable to, and, in general, will be used with multiple current density layers.

Figure 3:
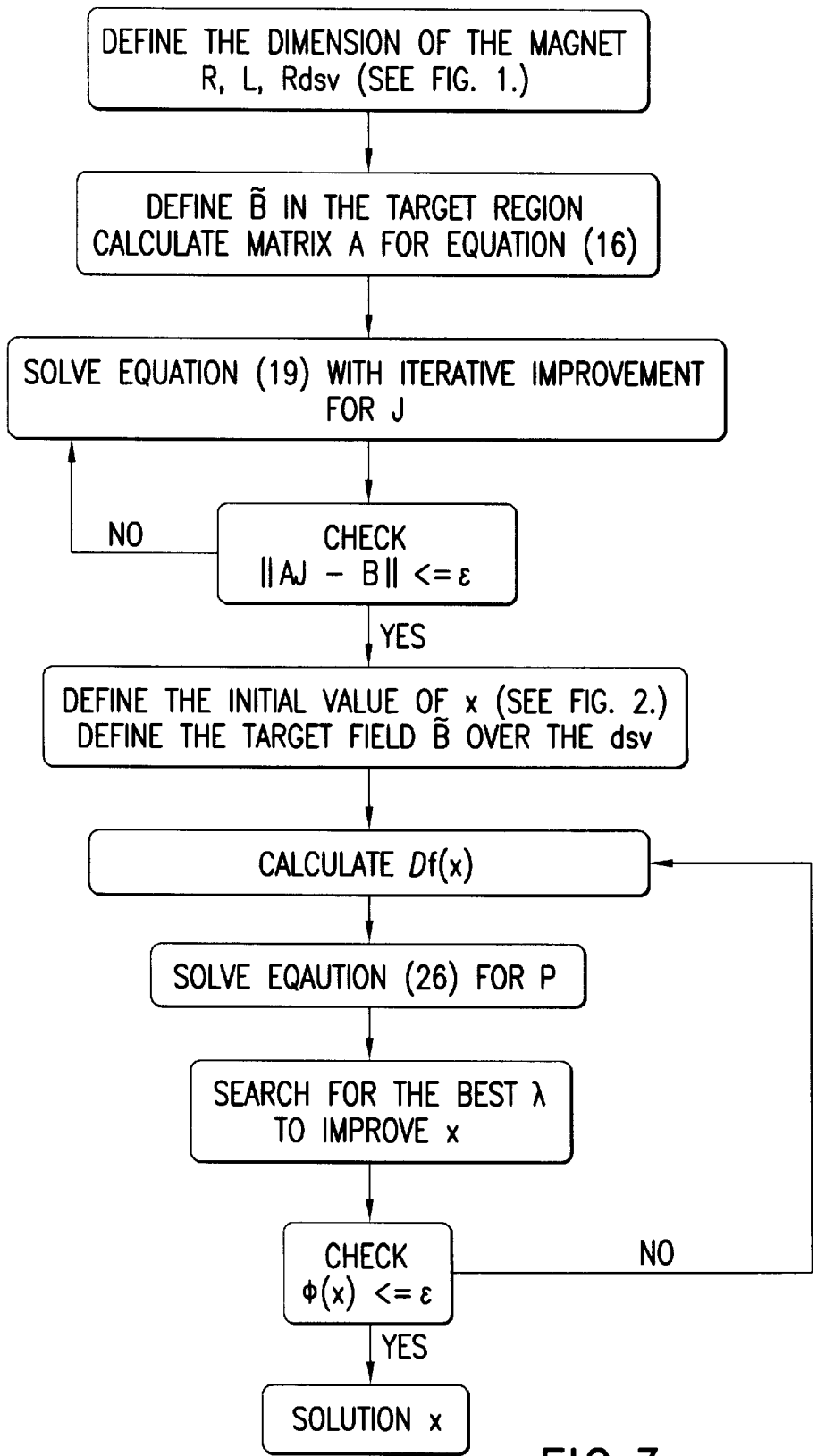
FIG. 3 is a flow chart useful in describing and understanding the method of the invention.

FIG. 3 illustrates the overall numerical procedure of the invention with reference to the various equations presented below.

I. Current Density Analysis

In general, the structure of a clinical MRI magnet comprises an air-cored coil. The first step in the method of the invention is to find a source current density which is constrained to the surface of a cylinder of fixed length. In particular, a current density J needs to be found which will produce a homogeneous magnetic field over the dsv. For the magnetic field analysis, the most effective basis unit is a single circular current loop $J(R,\xi)d\xi$. It then follows from Maxwell's equations that the magnetic induction dB(r,z) for a static field can be derived from the magnetic vector potential dA(r,z) according to the formula (see FIG. 1a):

$$dB(r,z,R,\xi) = \nabla \times dA(r,z,R,\xi) \quad (1)$$

where (r,z) is the field position coordinate, (R,ξ) is source location, and dA(r,z,R,ξ) is given by the generalized Biot-Savart law in the form:

$$dA(r,z,R,\xi) = \frac{\mu_0 J(R,\xi) d\xi}{4\pi} \int_0^\pi \frac{2R\cos\phi \, d\phi}{[R^2 + r^2 + (z-\xi)^2 - 2Rr\cos\phi]^{1/2}}. \quad (2)$$

The two field components are given as $$dB_r(r,z,R,\xi) = K_r(r,z,R,\xi) J(R,\xi) d\xi, \quad (3)$$

$$dB_z(r,z,R,\xi) = K_z(r,z,R,\xi) J(R,\xi) d\xi, \quad (4)$$

where $$K_r(r,z,R,\xi) = \frac{\mu_0}{2\pi} \frac{(z-\xi)}{r} \quad (5)$$
$$\frac{1}{[(R+r)^2 + (z-\xi)^2]^{1/2}} \left[ -E(k) + \frac{R^2 + r^2 + (z-\xi)^2}{(R-r)^2 + (z-\xi)^2} F(k) \right],$$

$$K_z(r,z,R,\xi) = \quad (6)$$
$$\frac{\mu_0}{2\pi} \frac{1}{[(R+r)^2 + (z-\xi)^2]^{1/2}} \left[ E(k) + \frac{R^2 + r^2 + (z-\xi)^2}{(R-r)^2 + (z-\xi)^2} F(k) \right],$$

and, $$k^2 = \frac{4Rr}{[(R+r)^2 + (z-\xi)^2]}, \quad (7)$$

$$E(k) = \int_0^{\pi/2} \frac{d\theta}{(1-k^2\sin^2\theta)^{1/2}}, \quad 2\theta = \pi - \phi, \quad (8)$$

$$F(k) = \int_0^{\pi/2} (1-k^2\sin^2\theta)^{1/2} d\theta. \quad (9)$$

Therefore, the magnetic field strength dB(r,z) at the point P(r,z), due to current J(R,ξ)dξ of the current ring at the point Q(R,ξ) is given as $$dB(r,z,R,\xi) = dB_r(r,z,R,\xi)\hat{r} + dB_z(r,z,R,\xi)\hat{z} \quad (10)$$

Figure 1A:
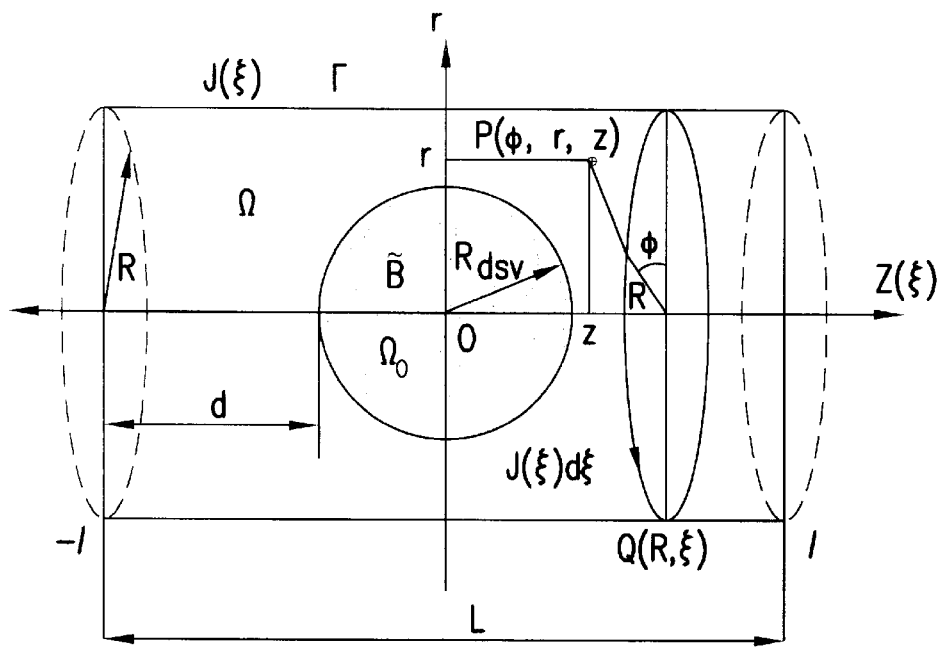
FIG. 1a is a schematic view of a cylindrical surface on which current density calculations are performed. The figure also shows the parameters used in the calculations, as well as a dsv which is symmetrically located relative to the ends of an MRI magnet.
Figure 1B:
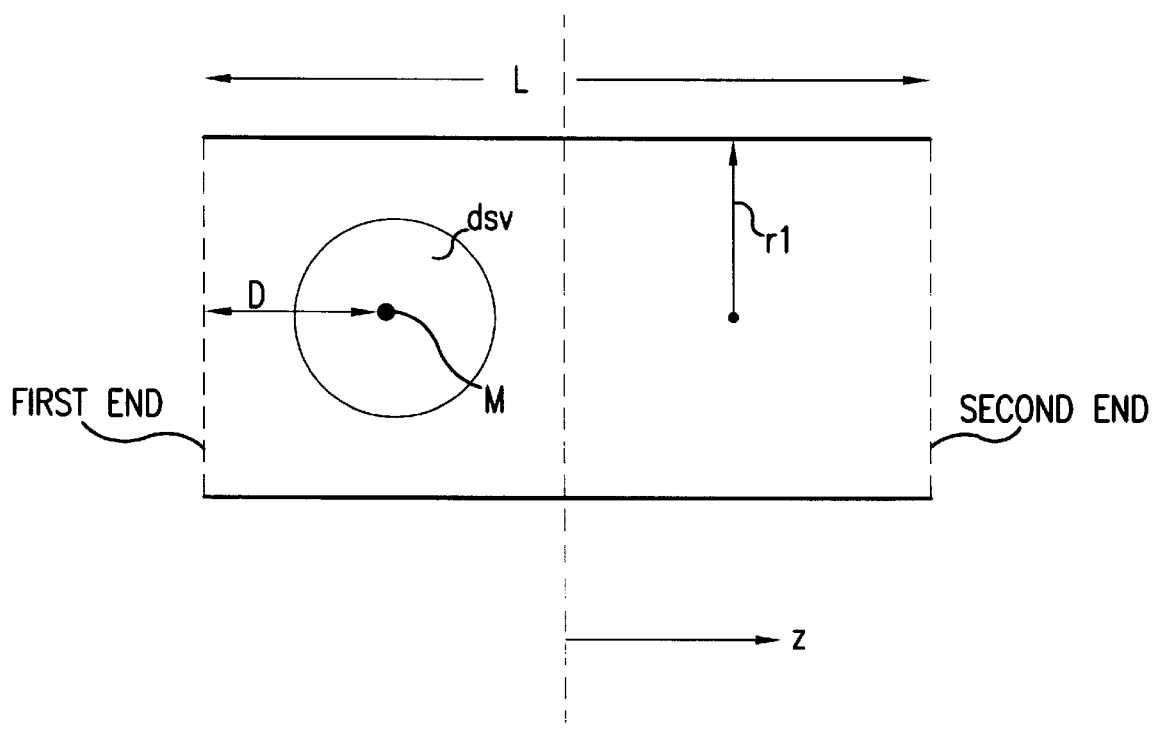
FIG. 1b is a schematic view of an MRI magnet having an asymmetrically-located dsv.

For the inverse approach, consider that in a closed three dimensional region Ω with the boundary surface Γ, as shown in FIG. 1a, a subregion $\Omega_0 \subset \Omega$, called the synthesis controlled subdomain is defined and within this region the function $\tilde{B}(r,z)$ is prescribed. The problem consists of searching for a boundary function J(R,ξ) that produces the field $\overline{B}(r,z)$ in $\Omega_0$ as close to the target field $\tilde{B}(r,z)$ as is possible. The basic formulation begins with the integration of the equation (10) giving $$\int_{(R,\xi)\in\Gamma} dB(r,z,R,\xi) = \tilde{B}(r,z), \, (r,z) \in \Omega_0 \quad (11)$$

$$\int_{(R,\xi)\in\Gamma} dB_r(r,z,R,\xi)\hat{r} + dB_z(r,z,R,\xi)\hat{z} = \tilde{B}_r(r,z)\hat{r} + \tilde{B}_z(r,z)\hat{z}. \quad (12a)$$

Substituting equations (3)–(6) into (12a) gives:

$$\int_{(R,\xi)\in\Gamma} [K_r(r,z,R,\xi)\hat{r} + K_z(r,z,R,\xi)\hat{z}] J(R,\xi) d\xi = \quad (12b)$$
$$\tilde{B}_r(r,z)\hat{r} + \tilde{B}_z(r,z)\hat{z}.$$

This is a linear Fredholm's equation of the first kind, where $K_r$ and $K_z$ are the kernels of the integral equation. For MRI magnet design, the radius R is usually fixed as a system requirement and $B_z$ is the only field component of interest in the dsv. Furthermore, for computational efficiency, the technique of the invention only considers the magnetic field distribution along the Z-axis in the first instance, with other points in the dsv being considered later in the process. Therefore, equation (12b) can be simplified to $$\int_{\xi\in\Gamma} K_z(z,\xi) J(\xi) d\xi = \tilde{B}_z(z), \, z \in \Omega_0 \quad (13)$$

where $K_z(z,\xi) = \mu_0 R^2/(2(R^2+(z-\xi)^2)^{3/2})$. In order to solve the integral equation (13) numerically, the boundary Γ is divided into n parts $\Delta\xi_j$. The unknown function J(ξ) is replaced by n unknown constants $J_j$ (j=1,2, ..., n), concentrated at the center points $\xi_j$ of each interval. The synthesis controlled subdomain $\Omega_0$ can also be discretized by the arbitrarily chosen points $z_i$, where i=1,2, ..., m. Consequently, the integral equation (13) can be replaced by the following system of algebraic equations $$\sum_{j=1}^n a_{ij} J_j = \tilde{B}_{zi}, \quad i = 1, 2, \ldots, m \quad (14)$$

where $\alpha_{ij} = \omega_j K_z(z_i,\xi_j)$ are the coefficients of the set of equations and are the products of weights of quadrature $\omega_j$ and the values of kernels $K_z(z_i,\xi_j)$. The $\tilde{B}_{zi} = \tilde{B}_z(z_i)$ are the given values of the specified constant field strength at $z_i$ in $\Omega_0$. The weights of quadrature for a trapezoidal rule are given by:

$$\omega_j = \Delta\xi_j, \text{ if } j \neq 1 \text{ or } j \neq n; \omega_j = \frac{1}{2}\Delta\xi_j, \text{ if } j = 1 \text{ or } j = n. \quad (15)$$

The set of equations (14) can be expressed in a matrix form as:

$$AJ = \tilde{B} \quad (16)$$

where A is a m×n matrix, J is a vector of n unknowns and $\tilde{B}$ is vector of m constants. Usually, m>n is chosen, which gives more information than unknowns. In general, numerical solution of equation (13) or (16) is a difficult task, because this problem belongs to the class of so-called ill-posed problems. To be able to solve this system, a regularization method is used, which, for example, can consist of replacing the ill-posed problem (16) by the well-posed problem:

minimize the functional $\Psi_\alpha(J) = \|AJ - \tilde{B}\|^2 + \alpha\|LJ\|^2$ (17)

over all J in a compact set satisfying $\|AJ - \tilde{B}\| \leq \epsilon$. (18)

See D. L. Phillips, "A technique for the numerical solution of certain integral equation of the first kind," J. Assoc.

Comp. Mech., 9, 84–97 (1962); and S. Twomey, "On the numerical solution of Fredholm integral equations of the first kind by the inversion of the linear system produced by quadrature," J. Assoc. Comp. Mech., 10, 97–101 (1963).

In equation (17), $\alpha$ is some fixed positive number, the so-called regularization parameter, and L is some linear operator (e.g. LJ=J, or LJ=J'). Under certain mild conditions, i.e., when J does not oscillate too rapidly, the problem (17) has a unique solution, denoted by $J_\alpha$. Moreover, $J_\alpha$ will converge to the solution of (16) as $\alpha \to 0$, provided that $\epsilon^2 \to 0$ no less rapidly than $\alpha$. The linear operator L is chosen in such a way that it will help to suppress wild oscillations in functions J for which $\|AJ-\tilde{B}\| \leq \epsilon$. However, this effect should not be too strong so that all oscillations in J are damped out. Using a variational argument, the solution of (17) can be shown to be the solution of $$(A^*A + \alpha L^*L)J = A^*\tilde{B}, \tag{19}$$

where $A^*$ and $L^*$ are the operators that are conjugate to A and L respectively. Equation (19) is a n×n linear system, and the LU decomposition method (see, for example, W. H. Press, S. A. Teukolsky, W. T. Vetterling and B. P. Fannery, "Numerical Recipes in C", Cambridge University Press, 683–688 (1992)) can be used with iterative improvement to compute the function J when the condition $\|AJ-\tilde{B}\| \leq \epsilon$ is satisfied.

II. Non-linear Optimization—Coil Implementation

Figure 2:
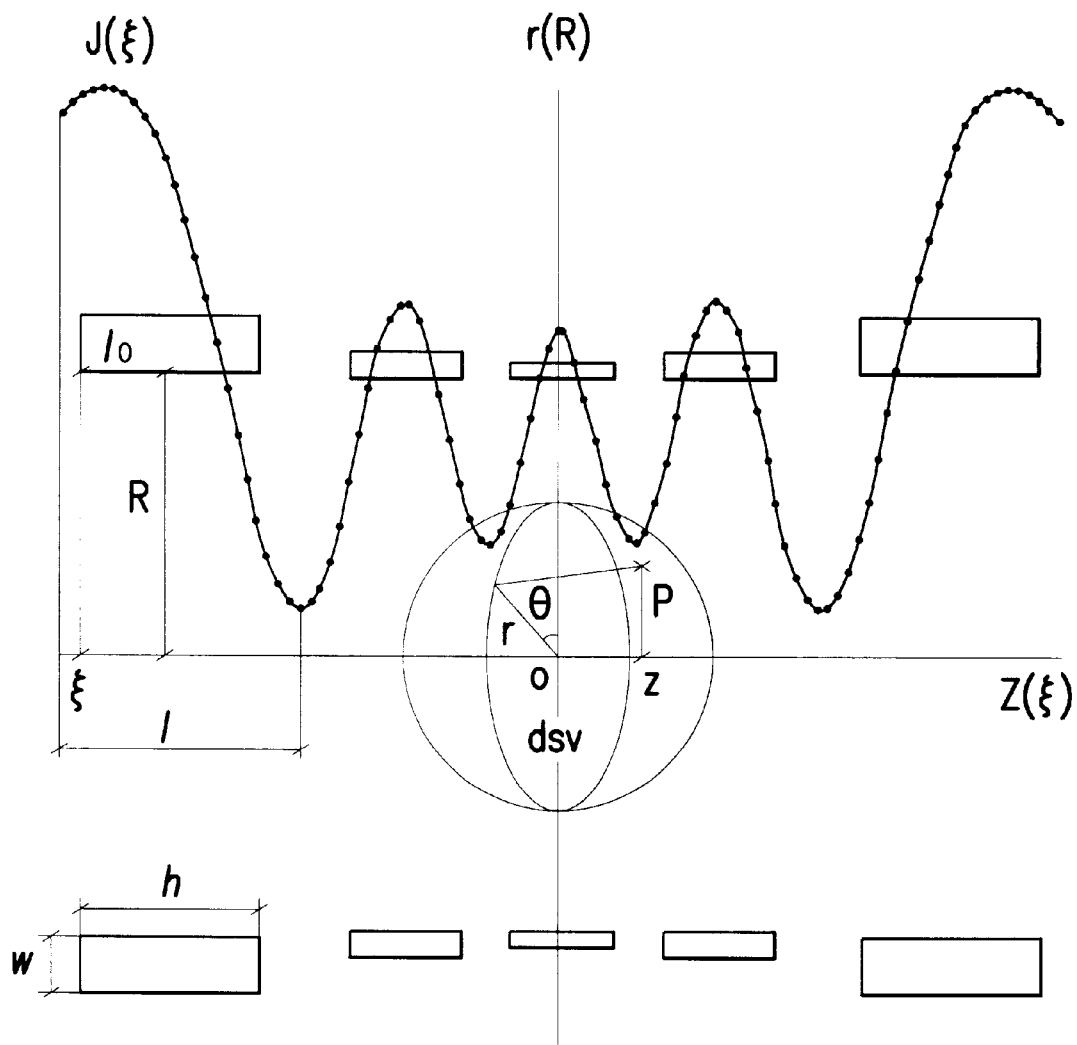
FIG. 2 is a view of a graph of current density oscillations with an initial coil configuration superimposed upon it.

In MRI magnet design, the magnet normally has to be partitioned into a number of coils, each of which has a rectangular cross section. Initially, the number of coils is determined by the number of oscillations in the solution for J obtained using the above-described current density analysis. The dimensions of the coils are then defined by (see FIG. 2):

$$w_j h_j I_0 = \int_{l_j} J(\xi) d\xi, \tag{20}$$

where $l_j$ is the length of the jth section of J, $w_j$ is width of the jth coil, $h_j$ is the height of the jth coil, and $I_0$ is the current carried by a unit cross section. All the coils are connected in series and carry the same transport current.

Once an initial discretization of the coil geometry has been made, based on J, the structure must be refined. In principle, the magnetic field produced by a coil having many turns of wire can be computed in the same way as above. All that is required is to apply the Biot-Savart law, and integrate along each turn in the (short) solenoids. However, if a very large number of turns are involved, this procedure becomes prohibitively expensive for optimization in terms of computer time. An alternative approach is therefore used for computing the magnetic field produced by a circular coil that contains a large number of turns wound onto a solenoid of rectangular cross section. The magnetic field analysis is given as:

$$B(r, \theta, z) = \sum_{j=1}^{N} M_{rj}(r, \theta, z, R_j, \xi_j, w_j, h_j) I_0 \hat{r} + \tag{21}$$

$$M_{zj}(r, \theta, z, R_j, \xi_j, w_j, h_j) I_0 \hat{z},$$

where N is the total number of the coils, $(r,\theta,z)$ is the field location, $(R_j,\xi_j,w_j,h_j)$ are the coordinates of the coil, and $M_r$ and $M_z$ are the kernels of the summation. See L. K. Forbes, S. Crozier and D. M. Doddrell, "Rapid Computation of Static Fields produced by thick circular solenoids" IEEE Trans. Magn. 33, 4405–4410 (1997).

For non-linear optimization design, the first step is to define a target field $\tilde{B}_z$ in a control region that can be a chosen number of sample points $\tilde{B}_{zi}(r_i,\theta_i, z_i)$. Then, the problem becomes to search for a solution set of $x=(R_j,\xi_j, w_j,h_j,j=1,2,\ldots,N; I_0)$, where x is an n dimensional vector (n=4N+1). These solutions produce a field $B_z$ that matches the target field in the control region, that is:

$$B_{zi}(r_i) = \sum_{j=1}^{N} M_{zj}(r_i, x_{k+4(j-1)}, k=1,\ldots,4)x_{(4N+1)} \tag{22}$$

$$= \tilde{B}_{zi}(r_i), \quad i=1,2,\ldots,m$$

where m is total number of control sample points, and $r_i=(r_i,\theta_i,z_i)$. Equation (22) can be rearranged as a system of homogeneous equations:

$$f_i(x) = \sum_{j=1}^{N} M_{zj}(r_i, x_{k+4(j-1)}, k=1,\ldots,4)x_{(4N+1)} - \tilde{B}_{zi}(r_i) \tag{23}$$

$$= 0, \quad i=1,2,\ldots,m$$

with n unknown variables. In general, $m \geq n$ is chosen so that equation (23) is an over-determinate system. This non-linear optimization problem can be solved as a non-linear least squares problem, that is: let D be a solution space, f: $D \subset R^n \to R^m$, $f=(f_1,f_2,\ldots,f_m)^T$, and define the function $$\Phi(x) = \frac{1}{2} f^T(x) f(x), \Phi: D \subset R^n \to R^1 \tag{24}$$

This function is a measure of the total difference between the target field and the field produced by the coils. The optimized x can be obtain by solving equation (24) for the minimum $\Phi$ value, that is $$\min_{x \in D} \Phi(x) = \min_{x \in D} \frac{1}{2} f^T(x) f(x). \tag{25}$$

This gives $$[Df^T(x^k)Df(x^k) + \alpha_k I] p_k(\alpha_k) = -Df^T(x^k)f(x^k). \tag{26}$$

$$x^{k+1} = x^k + \lambda_k p_k(\alpha_k), \tag{27}$$

where $$Df^T(x) = \begin{bmatrix} \frac{\partial f_1}{\partial x_1} & \frac{\partial f_2}{\partial x_1} & \cdots & \frac{\partial f_m}{\partial x_1} \\ \frac{\partial f_1}{\partial x_2} & \frac{\partial f_2}{\partial x_2} & \cdots & \frac{\partial f_m}{\partial x_2} \\ \vdots & \vdots & \ddots & \vdots \\ \frac{\partial f_1}{\partial x_n} & \frac{\partial f_2}{\partial x_n} & \cdots & \frac{\partial f_m}{\partial x_n} \end{bmatrix}, \tag{28}$$

$\alpha \geq 0$ is a damp factor, I is the identity matrix, p is the search direction and $\lambda$ is a parameter that can be found by using one dimensional non-linear optimization techniques. Equation (26) is a n dimensional linear system. The LU decomposition method can be used to solve for p. The solution x is obtained when $\Phi(x) \leq \epsilon$ is satisfied.

The process of the invention as described above is preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, C++, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by DIGITAL EQUIPMENT CORPORATION, IBM, HEWLETT-PACKARD, SUN MICROSYSTEMS, SGI or the like. For example, the numerical procedures of the invention can be implemented in C-code and performed on a Silicon Graphics Origin 2000 system.

Preferably, the processing portion of the computer system should have the following characteristics: a processing rate of 25 million floating point operations per second; a word length of 32 bits floating point, at least sixty four megabytes of memory, and at least 100 megabytes of disk storage. As discussed above, the system should include means for inputting data and means for outputting the results of the magnet design both in electronic and visual form. The output can also be stored on a disk drive, tape drive, or the like for further analysis and/or subsequent display.

Without intending to limit it in any manner, the present invention will be more fully described by the following examples.

RESULTS AND DISCUSSION

In this section, we begin with an analysis of the performance and accuracy of the hybrid numerical method described above. In particular, the following three symmetric magnet configurations will be used to illustrate the principles of the invention: length=0.80 m, length=1.0 m, length=1.50 m, with the free bore radius in all cases being approximately 0.5 m.

Firstly, the issue of the effect on numerical behavior of the regularization parameter $\alpha$ used in the current density analysis was studied. In this case, the overall length of the magnet was L=1.0 m and the radius of the free bore was R=0.5 m. The current J was discretized into 100 points. There were 150 points for the target field $\tilde{B}_z=1.0$ (T) located in the controlled subdomain that was 1.0 m in length along the Z-axis, see FIG. 1a. This gives $\gamma=0.0$ and the system is extremely difficult to solve. Three different regularization parameters were used ($\alpha=10^{-12}$, $\alpha=10^{-15}$ and $\alpha=10^{-17}$) to test the stability of the current density distribution and the relative error in $B_z$. Since the system is symmetric, only the solutions for one geometric half of the problems are presented.

Figure 4A:
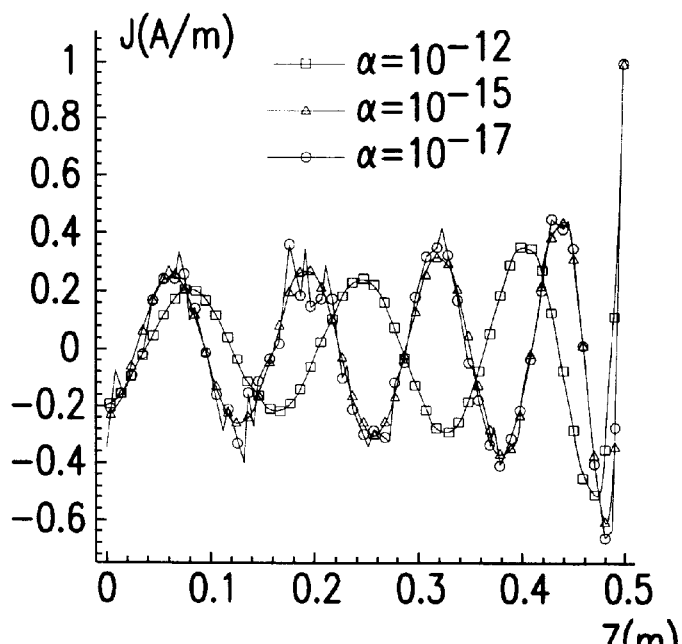
FIGS. 4a and 4b show plots of current density for different regularization parameters and of relative error in field distribution for these regularization parameters.
Figure 4B:
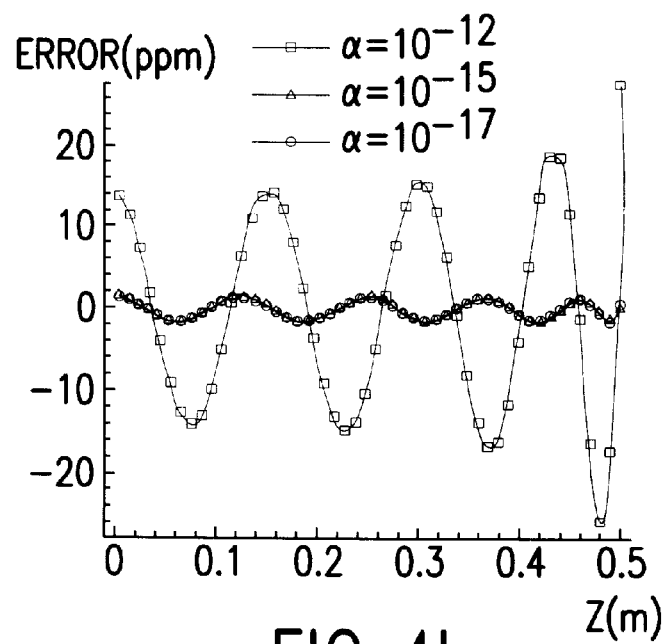

FIG. 4a shows the current density distributions corresponding to different values of $\alpha$. The solutions exhibit the same form when $\alpha=10^{-15}$ and $\alpha=10^{-17}$, but are different from the solutions when $\alpha=10^{-12}$. Furthermore, unstable oscillations appear in the solution for $\alpha=10^{-17}$. The relative error in the field distribution is illustrated in FIG. 4b, where it is seen that as $\alpha\to 0$, the error goes to zero. The current density distribution with $\alpha=10^{-15}$ gives the best result for this system. These results demonstrate that the solutions obtained from equation (19) are not unique because they depend on the parameter of regularization $\alpha$. In practice, persons skilled in the art can readily choose a value for $\alpha$ for any particular magnet design based on data of the type shown in FIG. 4.

To be able to design a structure for a length-constrained magnet, it is very important to be able to first obtain a current density profile for the magnet, so that the relation between coil structure and required magnetic field constraints can be visualized. Using the techniques of the invention, current density profiles for seven different magnet configurations were calculated, with magnet lengths of L=0.45, 0.50, 0.60, 0.80, 1.00, 1.50 and 2.00 (m). The radius of the free bore was R=0.5 m. The controlled subdomain was 0.45 m on the Z-axis at the center of the magnet. These configurations result in relaxation factors of $\gamma=0.00$, 0.050, 0.150, 0.350, 0.550, 1.050 and 1.550, respectively. The boundary domain for current flow was discretized into 100 points and the controlled subdomain was discretized into 150 points in all cases. As before, the system is symmetric and only half of the solutions are presented.

Figure 5A:
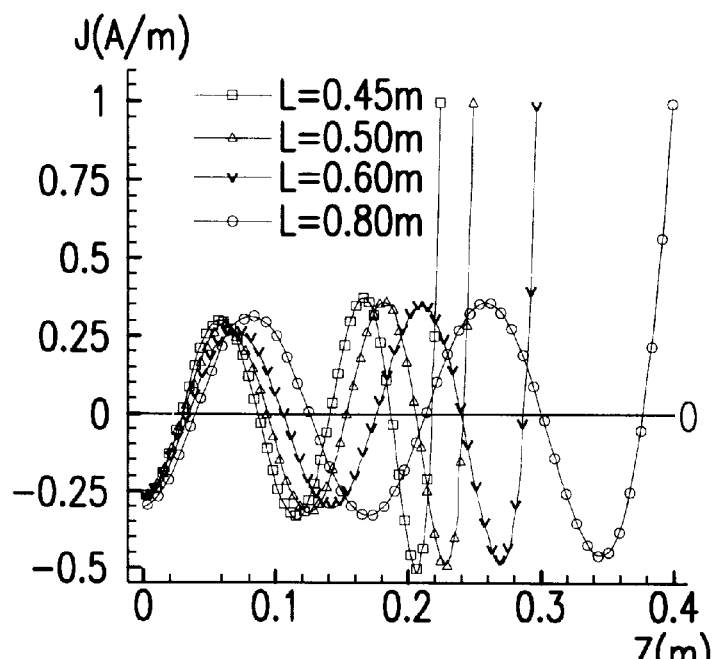
FIGS. 5a and 5b are plots of normalized current density for magnets of different lengths.
Figure 5B:
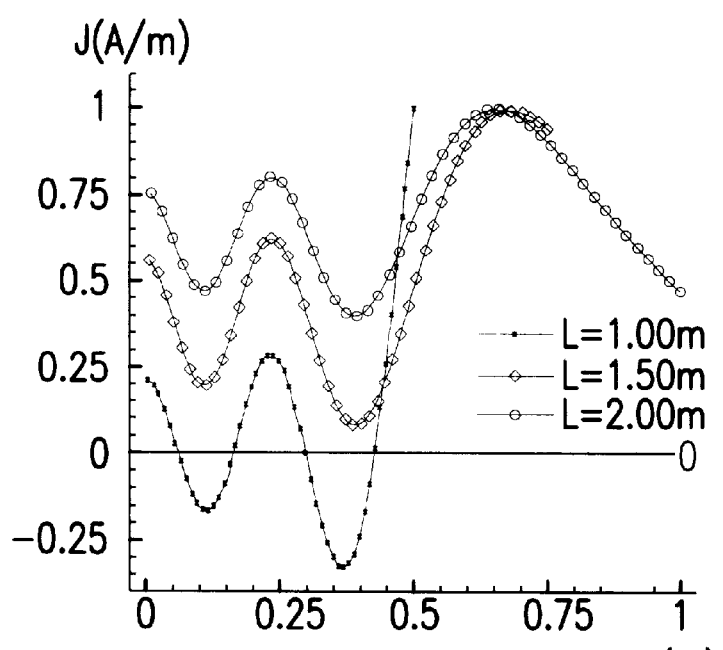
Figure 5C:
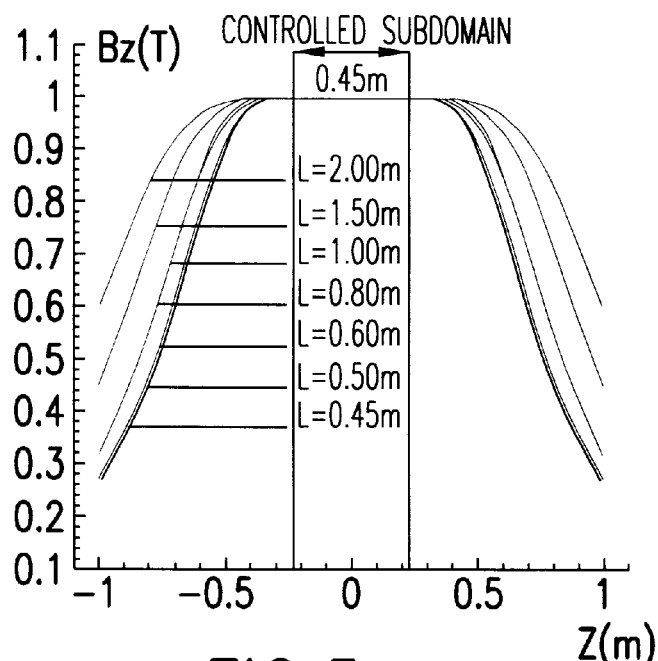
FIG. 5c is a plot of normalized field distribution along the z-axis for the magnets of different lengths of FIGS. 5a and 5b.
Figure 5D:
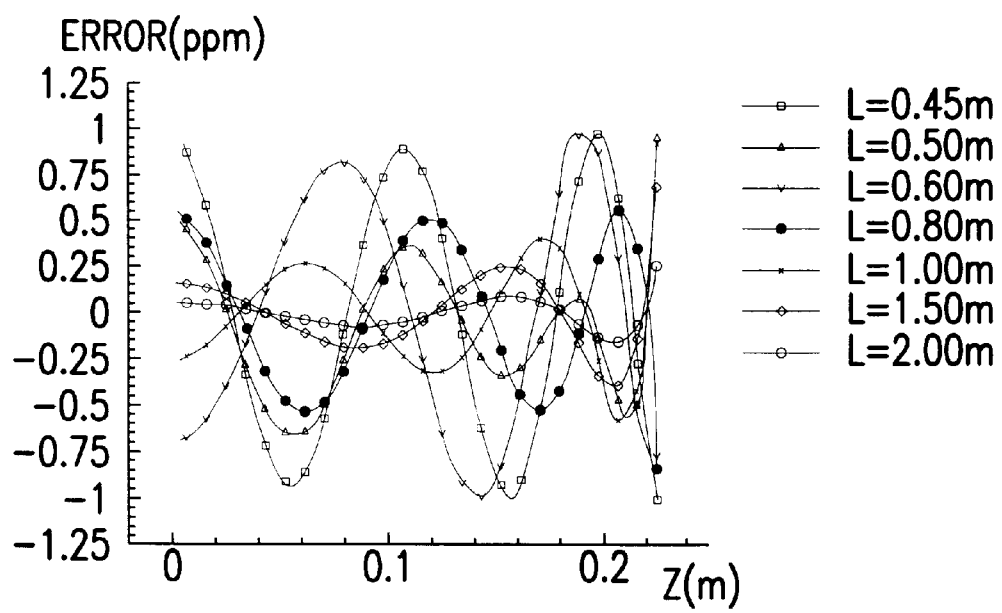
FIG. 5d is a plot of the relative errors for the magnets of different lengths of FIGS. 5a and 5b.
Figure 6:
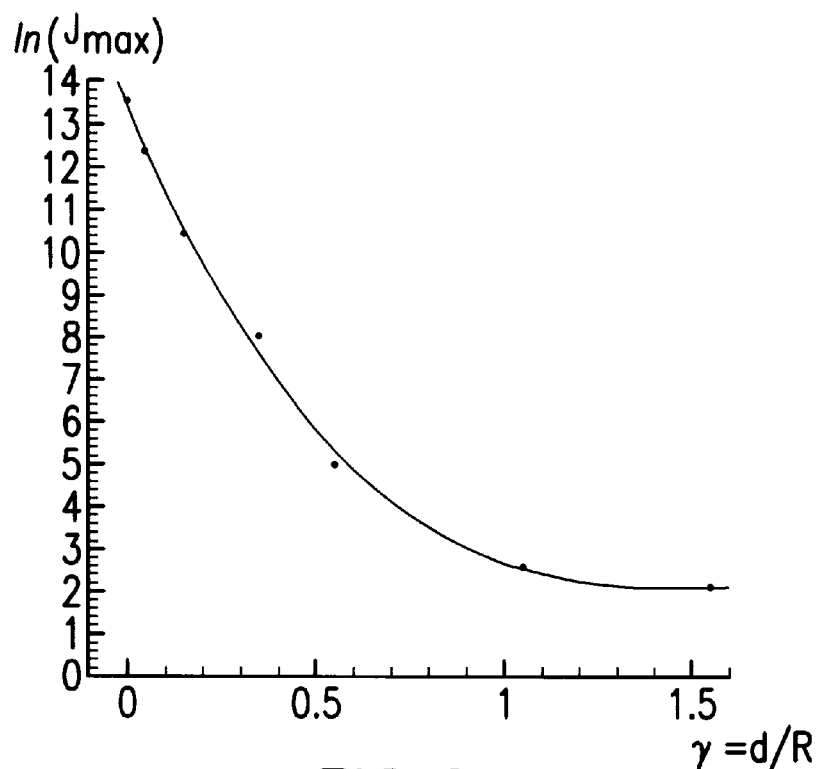
FIG. 6 is a plot of maximum current density versus the relaxation factor $\gamma$.

The normalized current density distributions are given in FIG. 5a and 5b. These solutions clearly show harmonic function behavior. Note that the current density profiles for the L=1.50 and 2.00 (m) magnets are all positive, while the rest are positively and negatively oscillating. This indicates that only positive current coils are needed for long magnets, while both positive and negative current coils are required for short magnets. The normalized magnetic field distributions are presented in FIG. 5c and the relative errors are exhibited in FIG. 5d. These results highlight the fact that the magnetic fields are very homogeneous in the controlled subdomain with maximal relative errors between +1 and -1 ppm for all the cases. The maximal relative error is inversely proportional to $\gamma$. The peak current $J_{max}$ is located at the end of the magnet. The maximum current density versus the relaxation factor $\gamma$ is given in FIG. 6, which shows that as $\gamma\to 0$ the peak current density $J_{max}$ becomes extremely large. This indicates that at least one large coil is required at the end of magnet.

It is interesting to note that for extremely short magnets, e.g., L=0.45 m and $\gamma=0.0$, the numerical algorithm still can find a solution for the current density profile with a resultant error less than 1 ppm. This demonstrates that an extremely short MRI magnet structure is theoretically possible. However, practical constraints on superconductor technology need to be considered in the design process and will limit how small $\gamma$ can be made.

Figure 7:
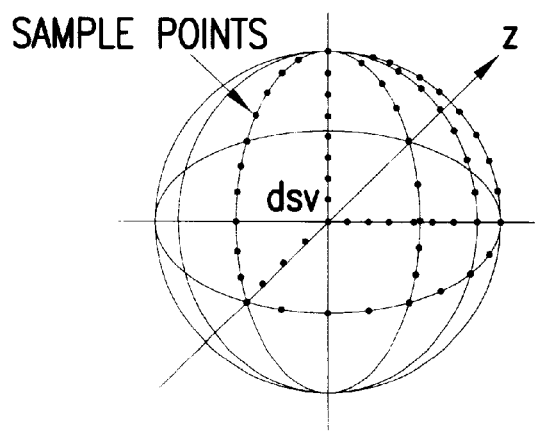
FIG. 7 is a view showing sample points over a dsv at which field strength can be determined.

The current densities shown in FIGS. 5(a) and 5(b) are converted into coil configurations using the non-linear optimization technique described above. Consider three magnet structures with L=0.8 m, 1.0 m and 1.5 m, and with the radius of the free bore being R=0.5 m. Also assume that the dsv is located at the center of the magnet with a radius of r=0.21 m. For these cases, 150 sample points evenly spaced over the dsv and including its surface were selected as exemplified in FIG. 7. The constant target field $\tilde{B}_z$ was set to 1.0 Tesla at each sample point of the dsv. The resulting continuous current density function shown in FIG. 5a is clearly oscillating. According to these current distributions, initially, 11 coils are required for the 0.8 m magnet, 9 coils for the 1.0 m magnet, and 5 coils for the 1.5 m magnet to reasonably approximate the continuous current distribution. See FIG. 2. For convenience of initial design, the same turns density was used for all the coils and a constant transport current was assumed.

Since the initial values of the coil dimensions and positions were determined from a continuous current density profile, the assumption was made that the initial set of x were in the domain of the global minimum. This has been confirmed by running several simulated annealing algorithms on the initial values to ensure that they are in the vicinity of the global minimum. See, for example, U.S. Pat. No. 5,818,319. The non-linear method of the present invention then descends to the optimal solution. The final results for the above three magnets with L=0.8 m, 1.0 m and 1.5 m are given in FIG. 8 and Table 1.

Figure 8A:
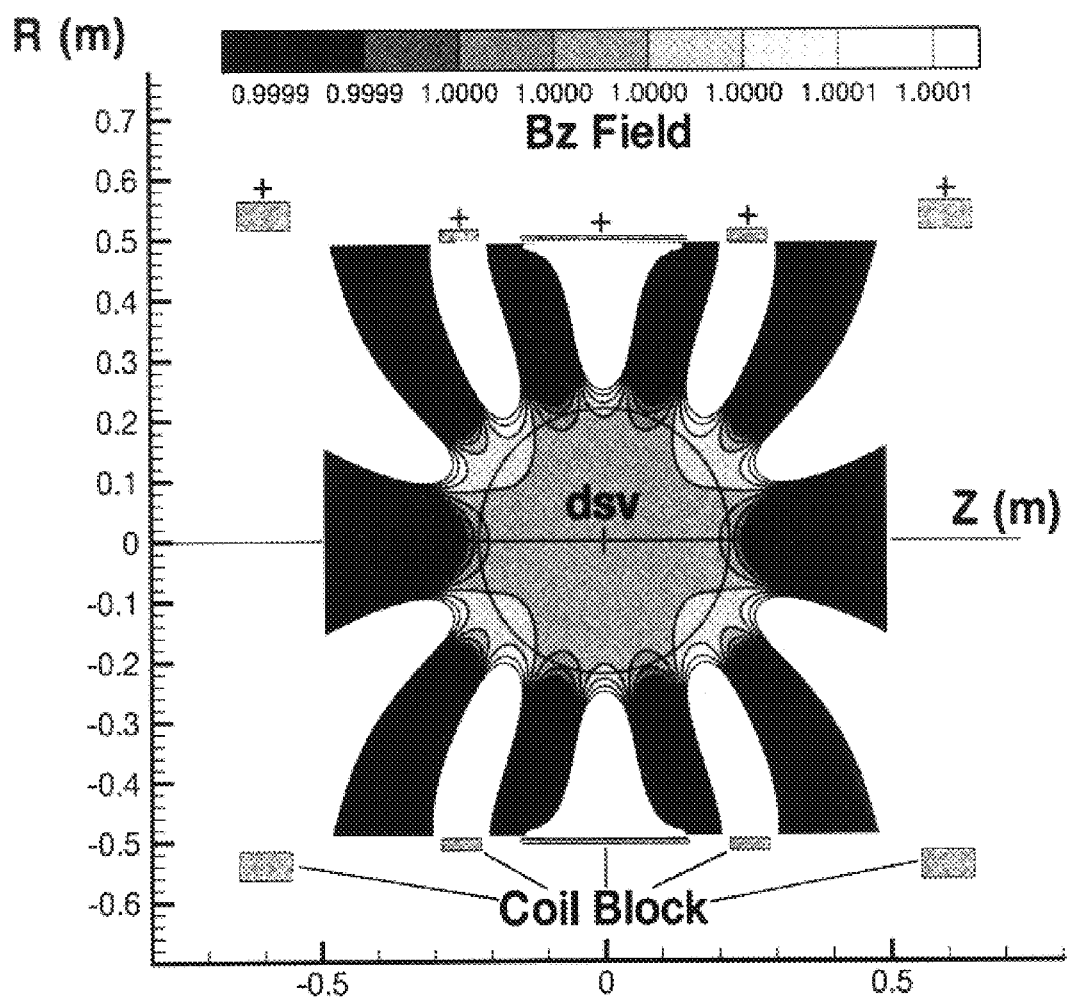
FIGS. 8a, 8b, and 8c show field distributions and coil configurations for a non-linear optimization with five coils for a magnet having a length of 1.3 m, nine coils for a magnet having a length of 1 m, and seven coils for a magnet having a length of 0.8 m, respectively.
Figure 8B:
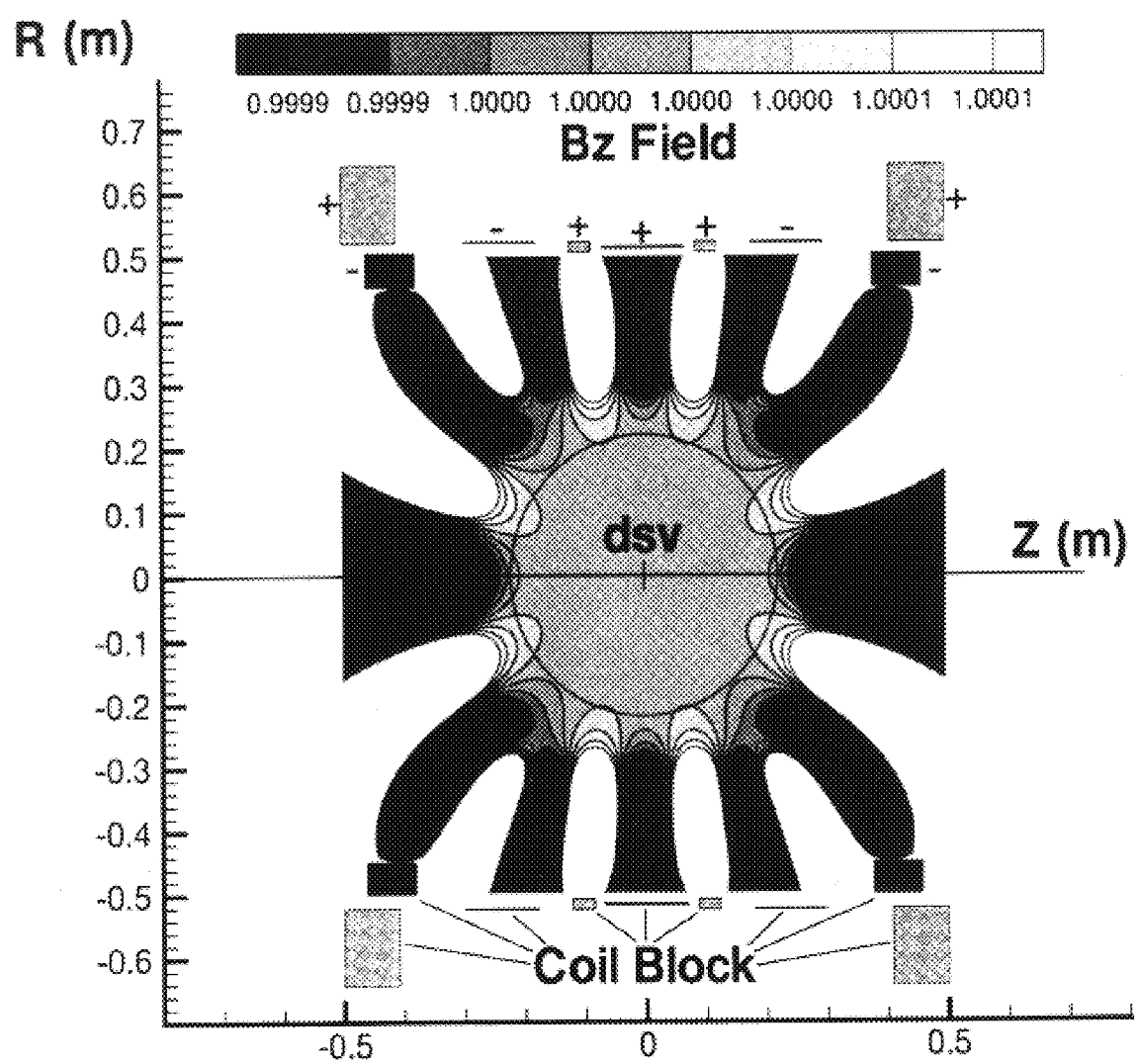
Figure 8C:
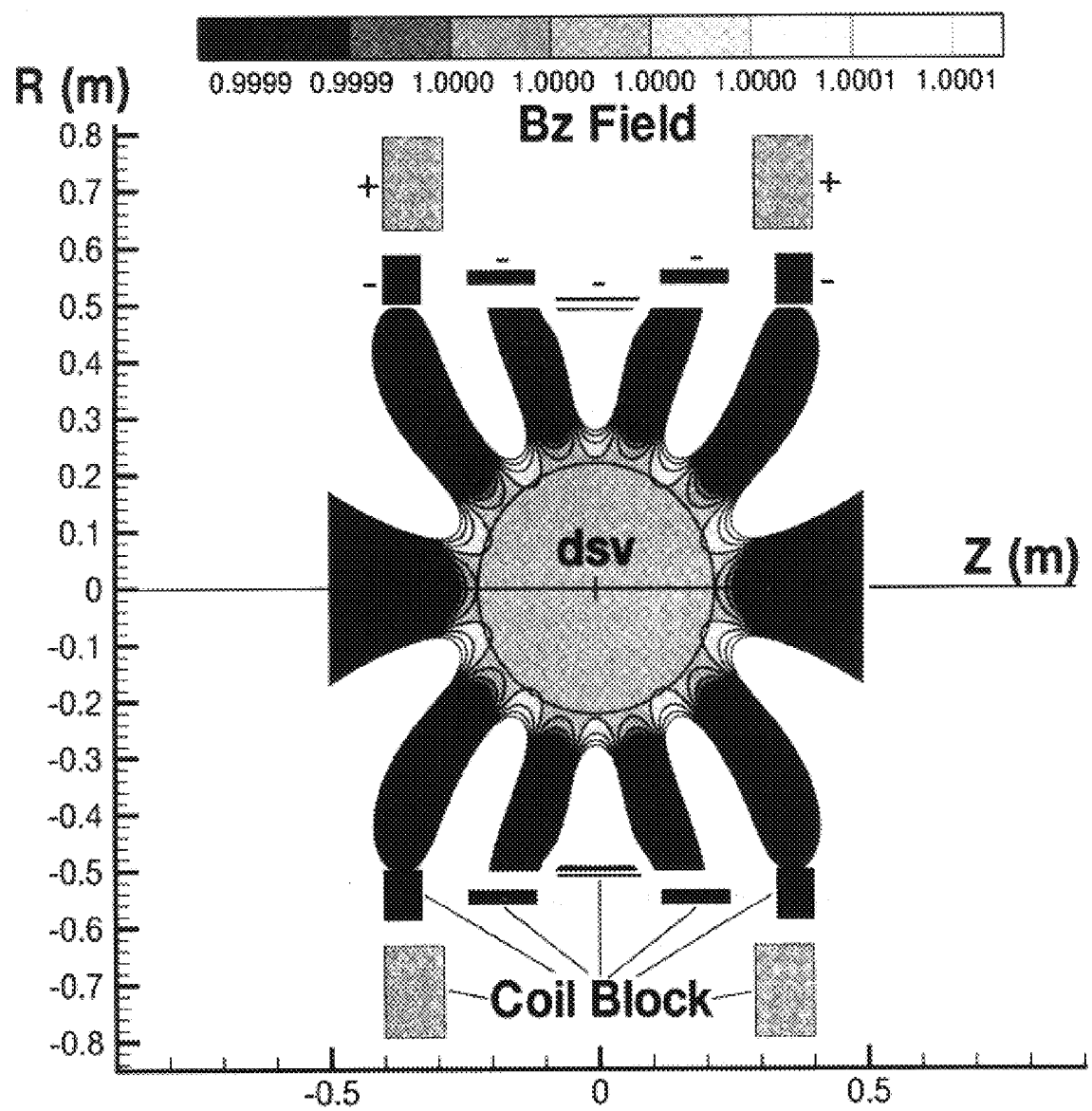
Figure 8D:
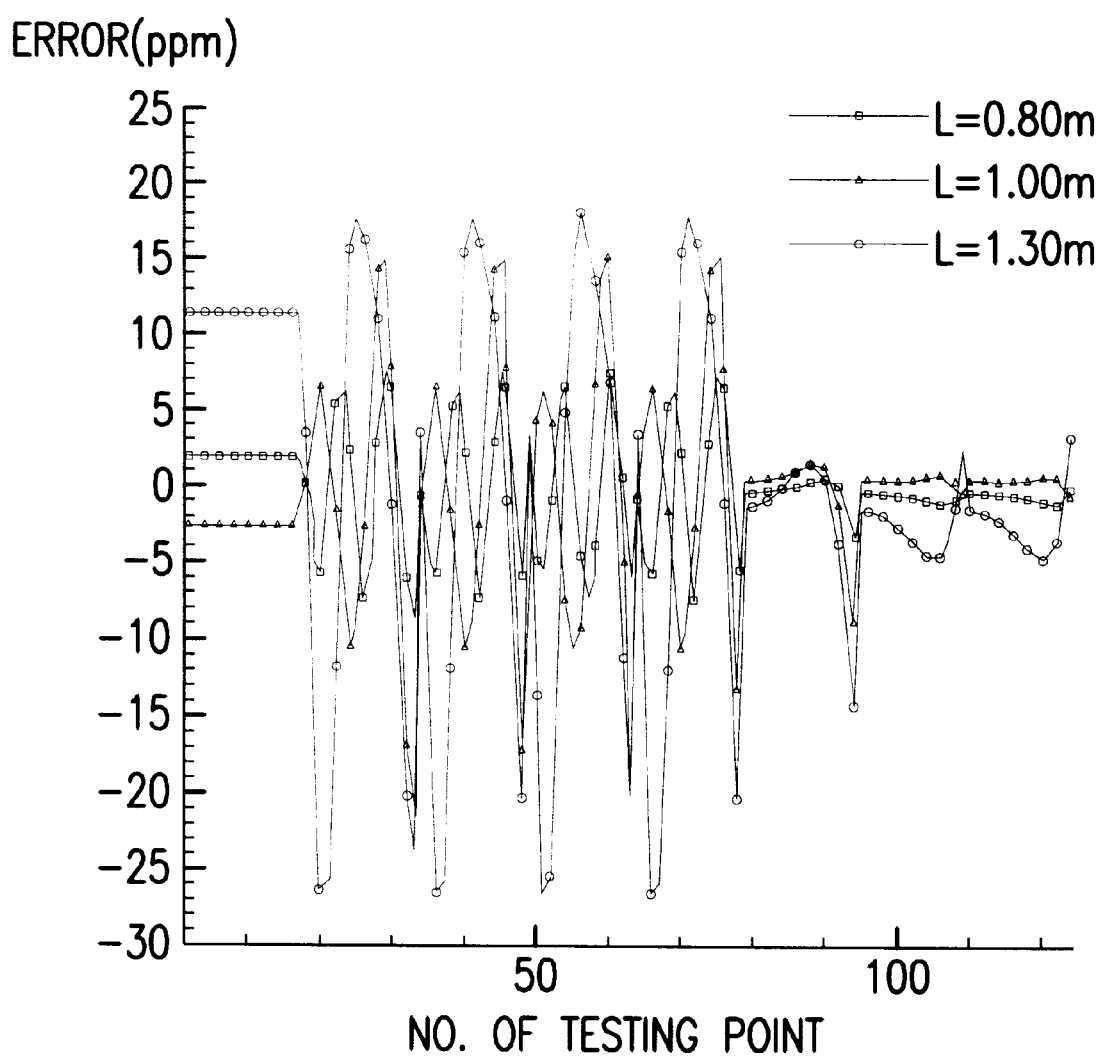
FIG. 8d is a plot of peak relative error for the configurations of FIGS. 8a, 8b, and 8c.

From FIG. 8a, it can see that the non-linear optimization initially starts with 5 positive coils for the L=1.5 m magnet. The final solution also gives 5 positive coils, however, the over all length of the magnet reduces to 1.3 m during refinement. The L=0.8 m magnet begins with 11 coils, while the final solution only shows 7 coils with two positives and 5 negatives. See FIG. 8c. The other coils coalesced or cancelled during the refinement process, illustrating the strong non-linear behavior between magnet structure and generated magnetic field. The peak relative error is presented in FIG. 8d, which illustrates the worst situation of the field on the surface of the dsv. Note that the current density distributions of FIG. 5 only guarantee the homogeneity of the $B_z$ field on the Z-axis within the dsv so that testing the homogeneity on the surface of the dsv represents a worst case analysis.

When the non-linear optimization technique of the invention was used to refine the coil structure for $B_z$ homogeneity specified over the entire dsv, the solution was, not surprisingly, different from that when only the Z-axis fields were considered. The magnitude of the error in homogeneity was reduced for this case compared with the case where $B_z$ was specified only on axis. However, the final solution for the coil structure had the same general topology as that predicted by the initial current density analysis. This illustrates the advantage of using the current density analysis as the starting point for determining the coil configuration.

Figure 9:
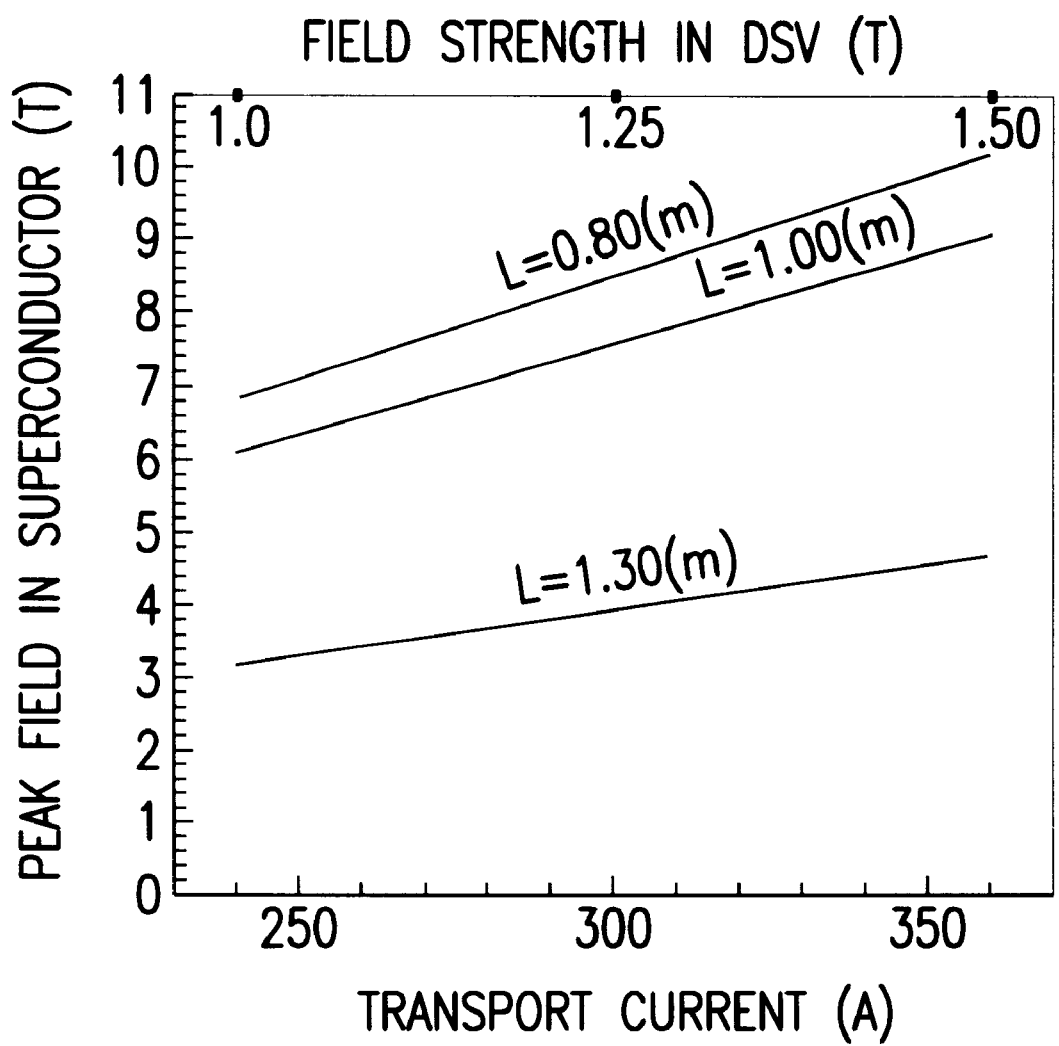
FIG. 9 illustrates the relationship between the field strength in the dsv, the transport current in all coils, and the maximum peak field in the coils.

To be able to make a magnet that is buildable, the peak fields and current densities must be within working limits of NbTi or other available superconductors. The relations between the field strength in the dsv and the transport current and the peak field in the superconductor is illustrated in FIG. 9, which concludes, not surprisingly, that a long magnet is easier to build than a short one.

Figure 10A:
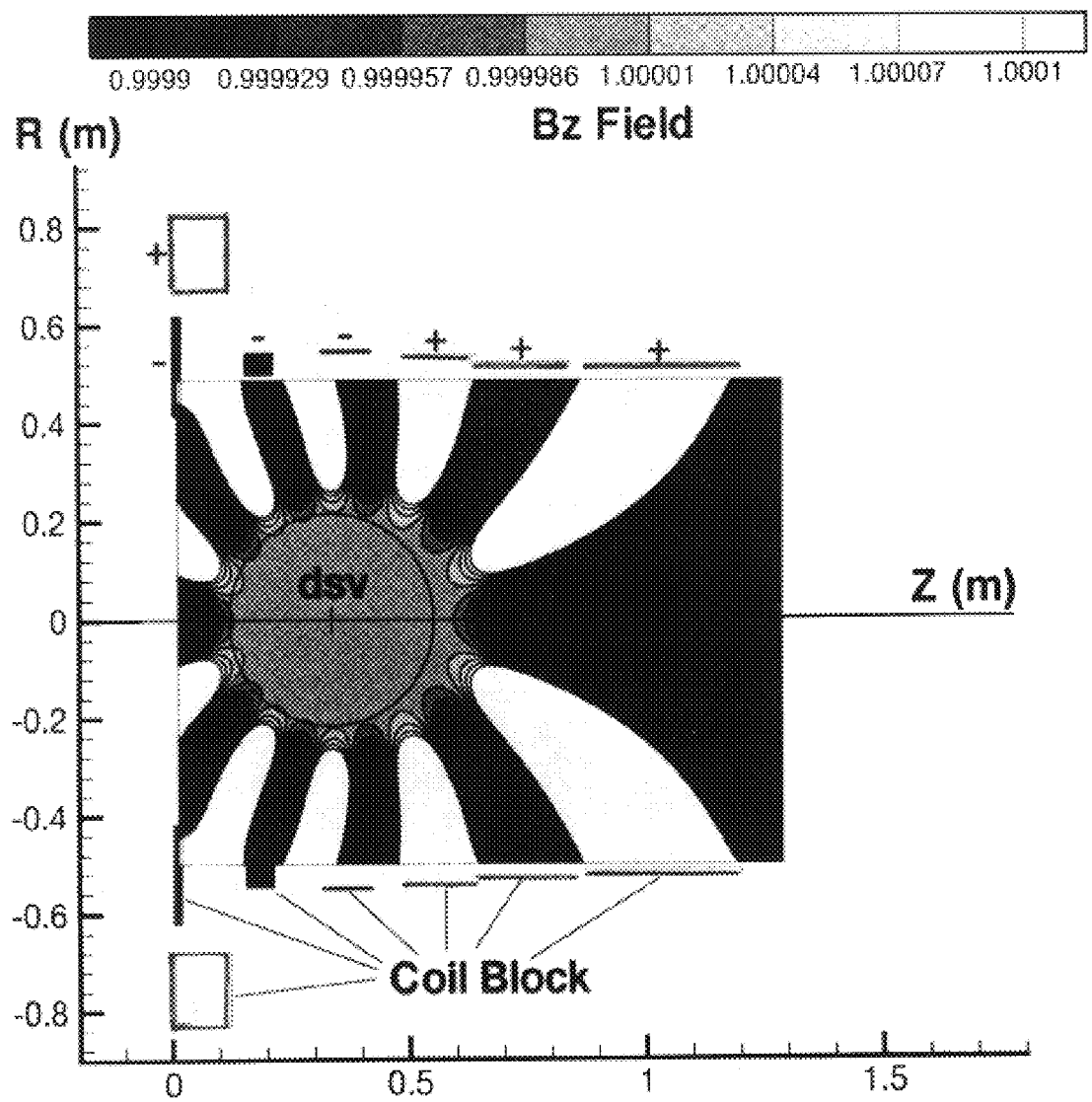
FIG. 10a is a plot showing field distribution and coil configuration for a magnet having an asymmetrically positioned dsv.
Figure 10B:
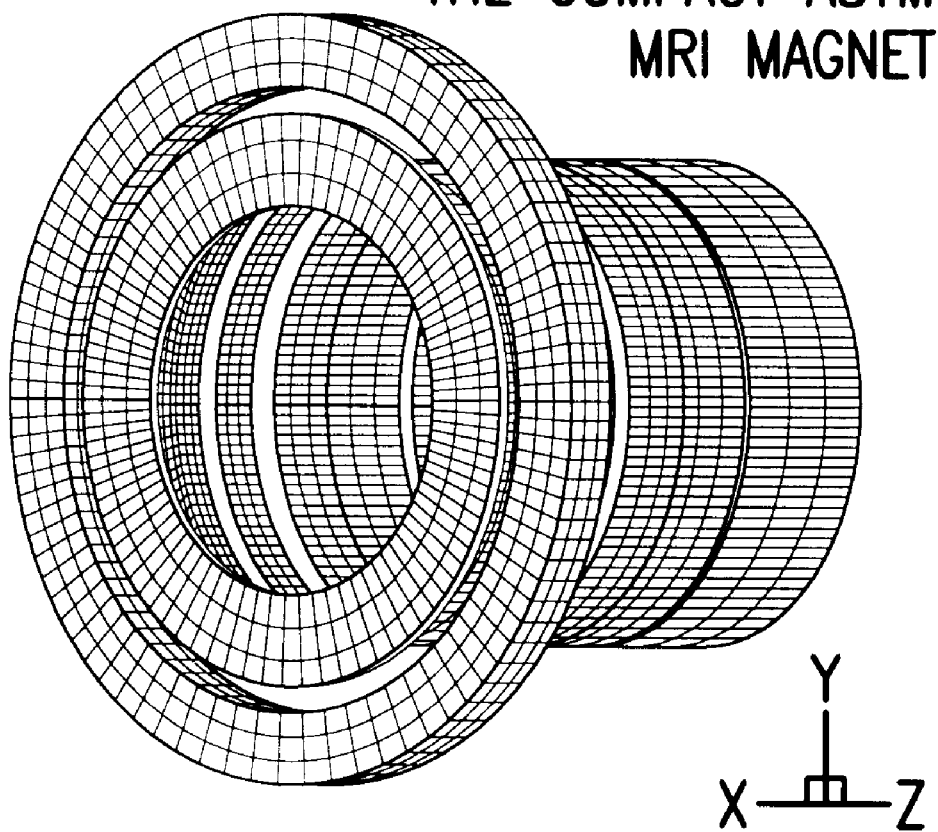

Using the techniques of the invention, a compact asymmetric MRI magnet design was optimized. The result is given in FIG. 10 and Table 2, wherein Table 2A gives performance results and Table 2B gives the coil structure, dimensions, and current directions. The constant target field $\bar{B}_z$ was set to 1.0 Tesla. This design had a volume rms inhomogeneity of about 8 ppm over a dsv of 45 cm, the epoch of which was 11.5 cm from the end of the magnet. This magnet structure is buildable and the peak fields and current densities are within working limits for NbTi superconductors. The contour plot of magnetic field in FIG. 10a illustrates the position and purity of the dsv. FIG. 10b provides a perspective view of the final magnet structure.

As discussed above, the method of the invention can be used with multiple layers of current density, wherein each layer is specified on a different radius. One application of multi-layer designs is to provide active shielding for the magnets, where the stray field emanating from the magnet may be reduced and therefore the operator of the system may reside closer to the magnet structure and siting costs may be reduced. FIG. 11 illustrates an application of the method to multiple layers, where FIG. 11a shows two current densities calculated for an asymmetric magnet having a length of 1.2 m. The current densities are at layers R=0.5 m and R=0.8 m.

Figure 11B:
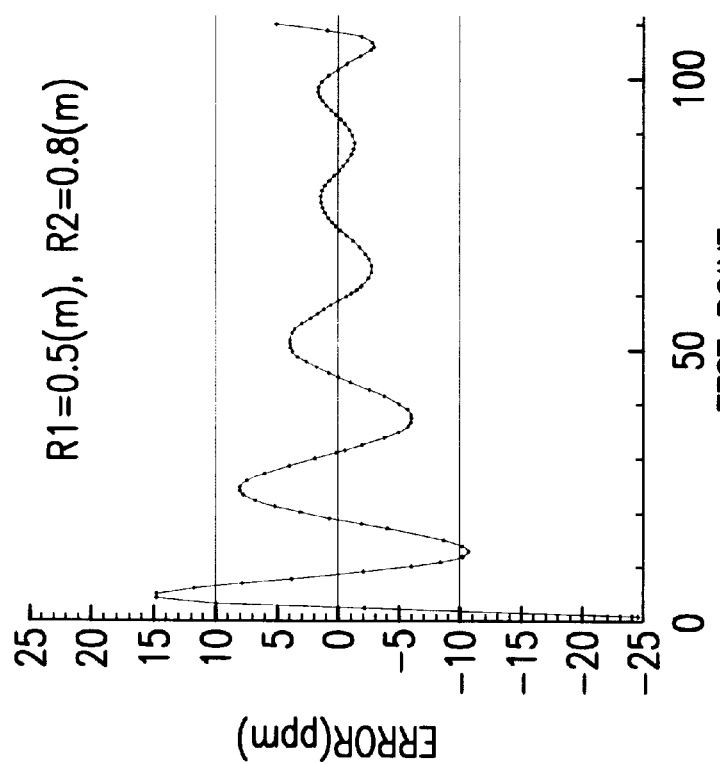
FIG. 11b is a plot of homogeneity on a 45 cm dsv of a magnet which is 1.2 m in length and where the epoch of the dsv is 12 cm from one end of the magnet, i.e., D=34.5 cm.
Figure 11A:
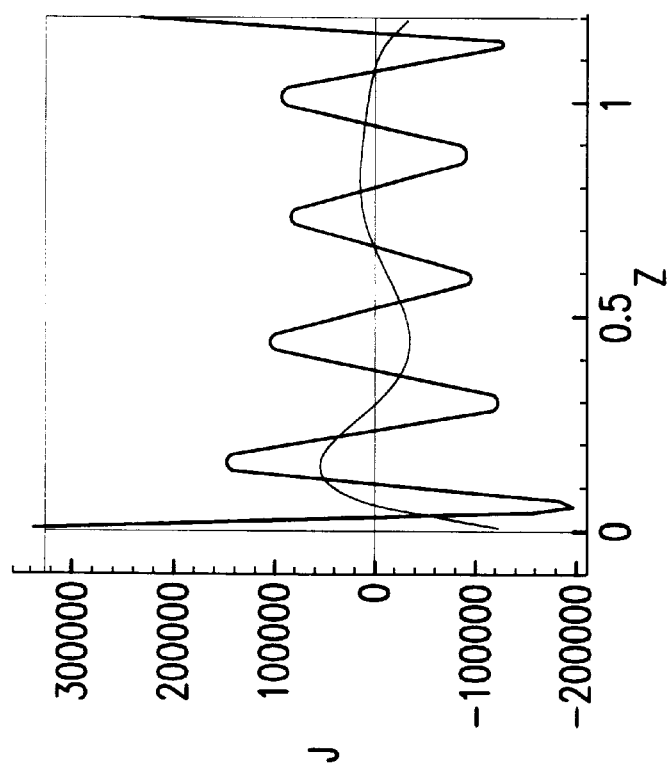
FIG. 11a shows current densities for a two layer asymmetric magnet, with the more rapidly varying current density being the inner layer and the less rapidly varying current density being the outer layer.

FIG. 11b shows the resultant homogeneity for a 45 cm dsv having its epoch 12 cm from one end of the magnet. The data of this figure shows that a suitably homogeneous field was achieved. Moreover, the stray field was reduced to 5 gauss ($5 \times 10^{-4}$ Tesla) on a distorted ellipsoid having a major axis radius of approximately 5 m and a minor axis radius of approximately 3 m measured from the center (midpoint) of the dsv.

FIGS. 12 and 13 illustrate the use of two current layers for an asymmetric system (FIG. 12 and Table 3) and three current layers for a symmetric system (FIG. 13). In each case, panel a shows the current density determined using the current density analysis, panel b shows the final coil configuration after non-linear optimization, as well as the position and purity of the dsv, panel c shows the stray field contour at 5 gauss, and panel d shows the peak field distribution in the superconducting coils. FIG. 12e shows the turn distribution function for the magnet of FIG. 12b. As can be seen in this figure, the turn distribution function has its maximum value at the left hand end of the magnet, i.e., the end towards which the dsv is displaced. Each of the magnet designs of FIGS. 12 and 13 are readily buildable using available superconducting materials and conventional techniques.

As the foregoing demonstrates, a hybrid numerical method has been provided which can be used to design compact, symmetric MRI magnets as well as compact, asymmetric magnets. In particular, as demonstrated by the above examples, the method can be used to obtain a compact MRI magnet structure having a very homogeneous magnetic field over a central imaging volume in a clinical system of approximately 1 meter in length, which is significantly shorter than current designs. As also demonstrated by the examples, the method provides compact MRI magnet structures with relaxation factors $\gamma \leq 0.40$, so that the dsv region can be located as close as possible to the end of the magnet. In this way, the perception of claustrophobia for the patient is reduced, better access to the patient by attending physicians is provided, and the potential for reduced peripheral nerve stimulation due to the requisite gradient coil configuration is achieved.

As discussed in detail above, the method uses an inverse approach wherein a target homogeneous region is specified and is used to calculate a continuous current density on the surface of at least one cylinder that will generate a desired field distribution in the target region. This inverse approach to is akin to a synthesis problem. The inverse current density approach is combined with non-linear numerical optimization techniques to obtain the final coil design for the magnet. In the non-linear optimization, the field calculation is performed by a semi-analytical method.

While the invention has been described herein relative to its preferred embodiments, it is of course contemplated that modifications of, and alternatives to, these embodiments could be made. Such modifications and alternatives obtaining the advantages and benefits of this invention, will be apparent to those skilled in the art having reference to this specification and its drawings. For example, the invention has been described with reference to magnets for magnetic resonance applications. It should be appreciated that this is by way of example only and that the invention is also applicable for producing magnets for purposes other than MR applications. Similarly, the method has been illustrated for circularly symmetric systems, but may also be used with magnetic systems having non-circular cross-sections, such as elliptical cross-sections. Other variations will be evident to persons skilled in the art from the disclosure herein.

TABLE 1

Final Designs For Symmetric Systems

|  | Design 1 | Design 2 | Design 3 |
|---|---|---|---|
| Total length (m) | 1.3 | 1.0 | 0.8 |
| Field strength (T) | 1.0 | 1.0 | 1.0 |
| Transport current (A) | 240 | 240 | 240 |
| dsv (cm) | | | |
| 40 epoch(cm)/Vrms(ppm) | 45.0/4.37 | 30.0/1.31 | 20.0/1.01 |
| 45 epoch(cm)/Vrms(ppm) | 42.5/8.05 | 27.5/1.99 | 17.5/2.95 |
| 50 epoch(cm)/Vrms(ppm) | 40.0/16.08 | 25.0/4.84 | 15.0/8.37 |
| Wire length (km) | 23.539 | 58.548 | 93.152 |
| Peak field in superconductor (T) | 3.17 | 6.09 | 6.84 |

TABLE 2A

Asymmetric Magnet Design -- Single J Layer

| Total length (m) | 1.2 |
|---|---|
| Field strength (T) | 1.0 |
| Transport current (A) | 240 |
| dsv (cm) | |
| 40 epoch(cm)/Vrms(ppm) | 13.0/3.2 |
| 45 epoch(cm)/Vrms(ppm) | 11.5/8.2 |
| 50 epoch(cm)/Vrms(ppm) | 8.0/22.0 |
| Wire length (km) | 64 |
| Peak field in superconductor (T) | 8.0 |

TABLE 2B

Coil Configuration in Meters for Magnet of Table 2A

|  | R1 | R2 | Z1 | Z2 | J |
|---|---|---|---|---|---|
| Coil 1 | 0.678349 | 0.831083 | 0.000000 | 0.120118 | + |
| Coil 2 | 0.417993 | 0.622359 | 0.000000 | 0.017729 | − |
| Coil 3 | 0.500673 | 0.546588 | 0.153321 | 0.213309 | − |
| Coil 4 | 0.545729 | 0.552018 | 0.314059 | 0.422412 | − |
| Coil 5 | 0.537916 | 0.542539 | 0.485078 | 0.643620 | + |
| Coil 6 | 0.523675 | 0.526570 | 0.633419 | 0.845569 | + |
| Coil 7 | 0.510686 | 0.521938 | 0.872007 | 1.202192 | + |

TABLE 3

Figure 12A:
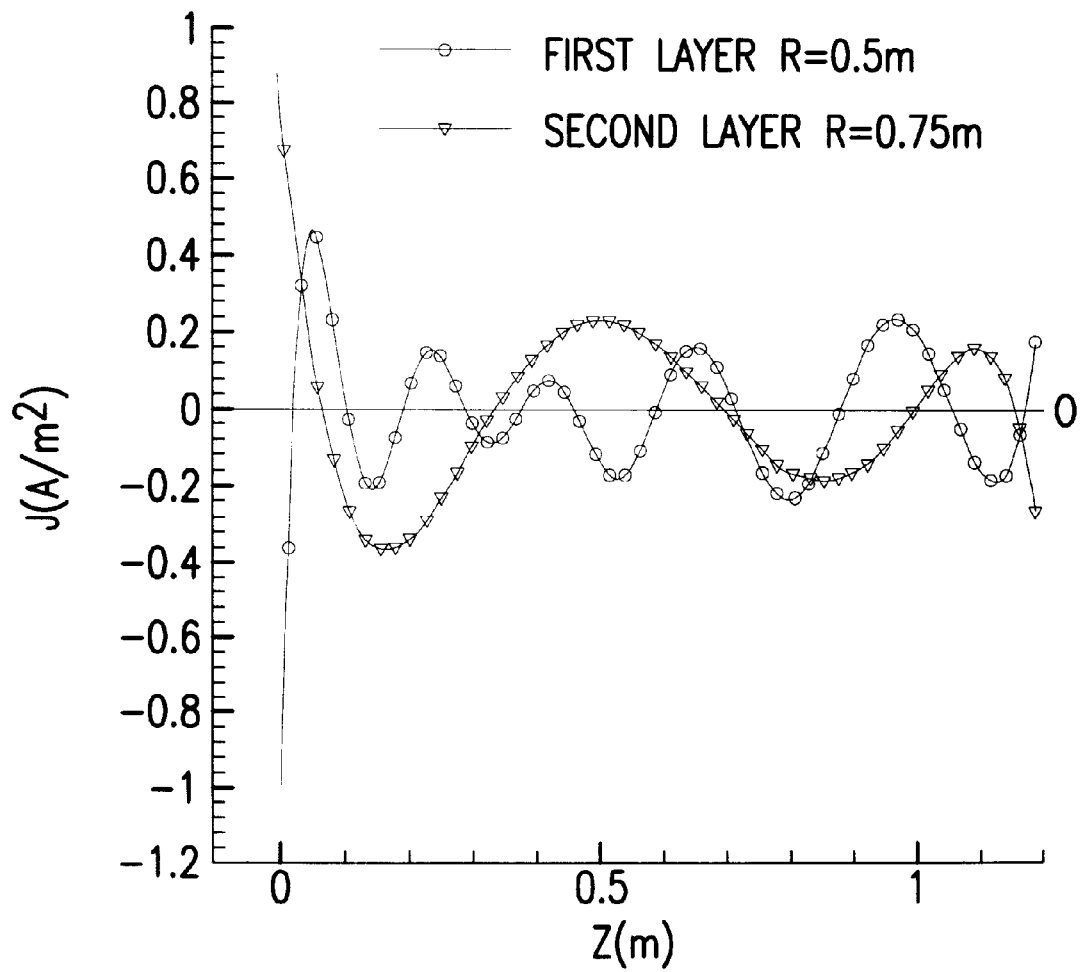
FIG. 12a shows current densities for another two layer asymmetric magnet, with the more rapidly varying current density being the inner (first) layer and the less rapidly varying current density being the outer (second) layer.
Figure 12B:
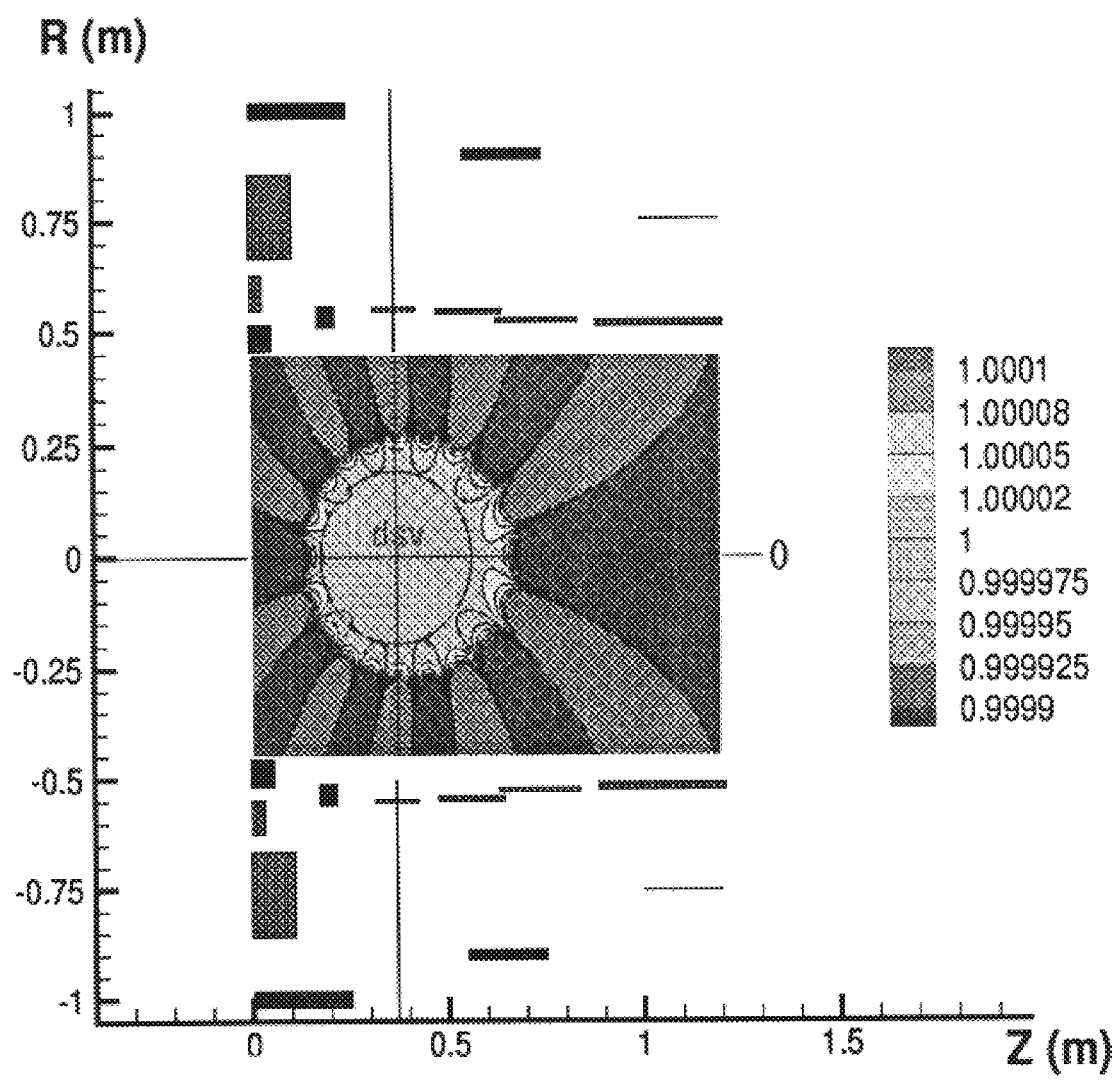
Figure 12C:
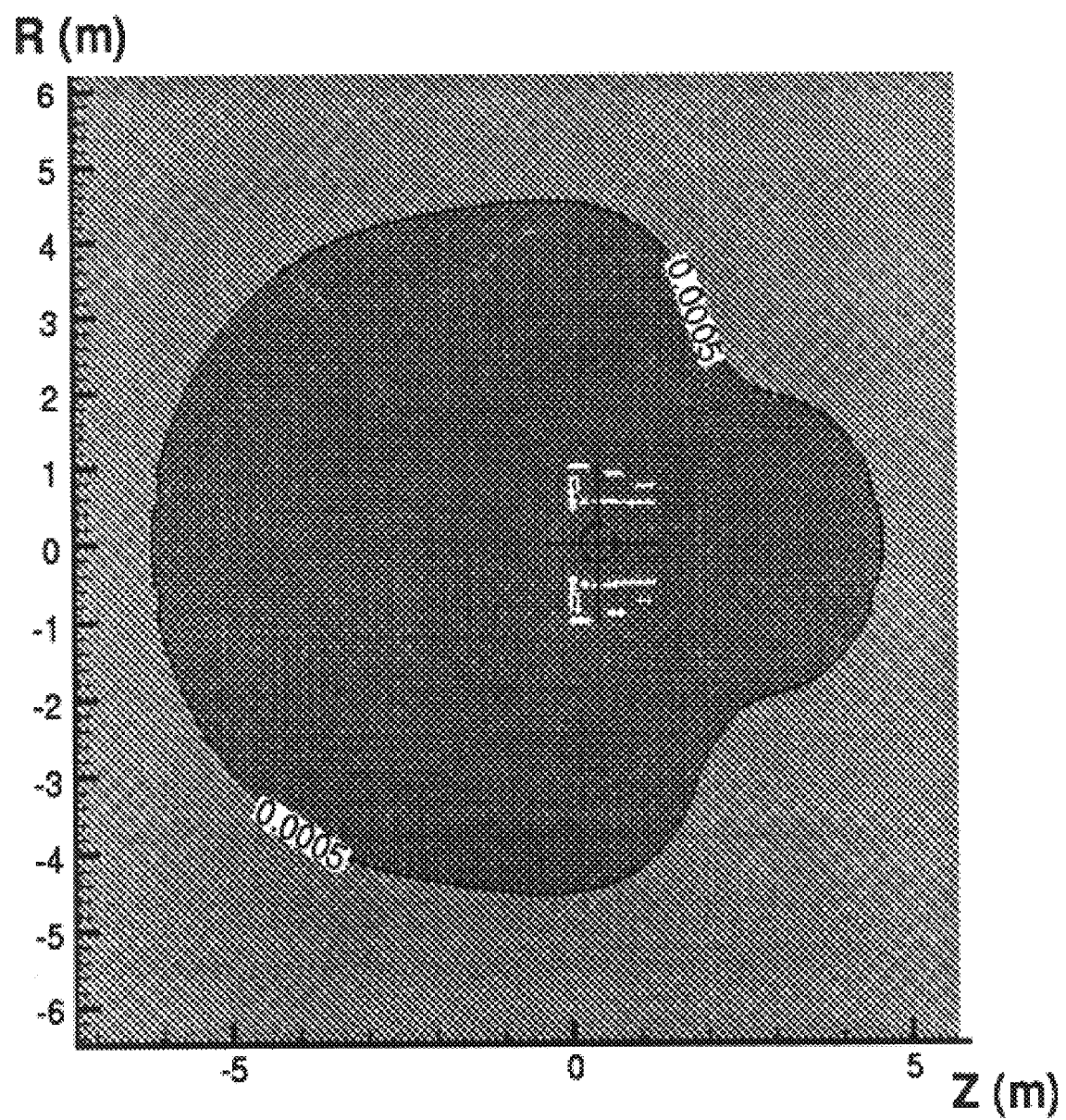
FIG. 12c shows the $5 \times 10^{-4}$ Tesla external stray field contour for the magnet of FIG. 12b.
Figure 12D:
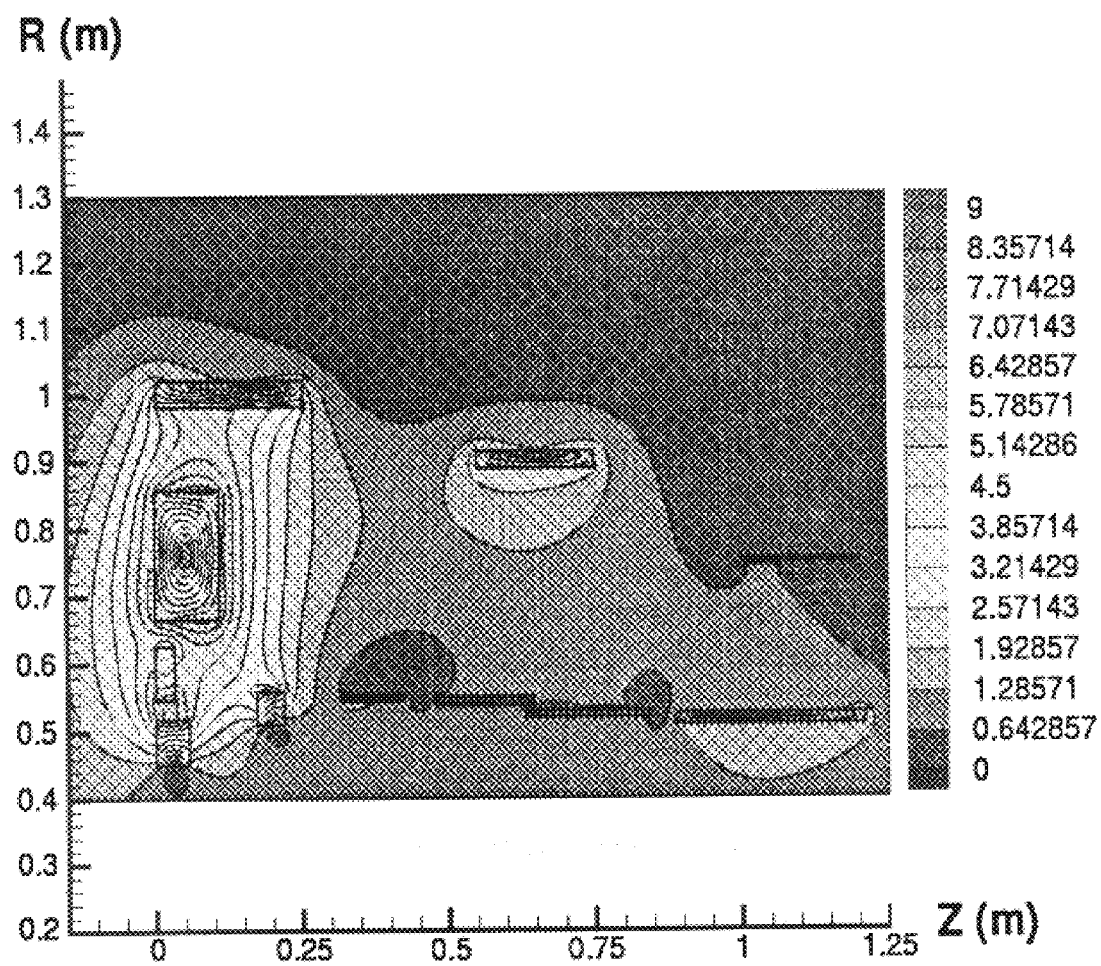
FIG. 12d shows the peak field distribution within the coils of the magnet of FIG. 12b.
Figure 12E:
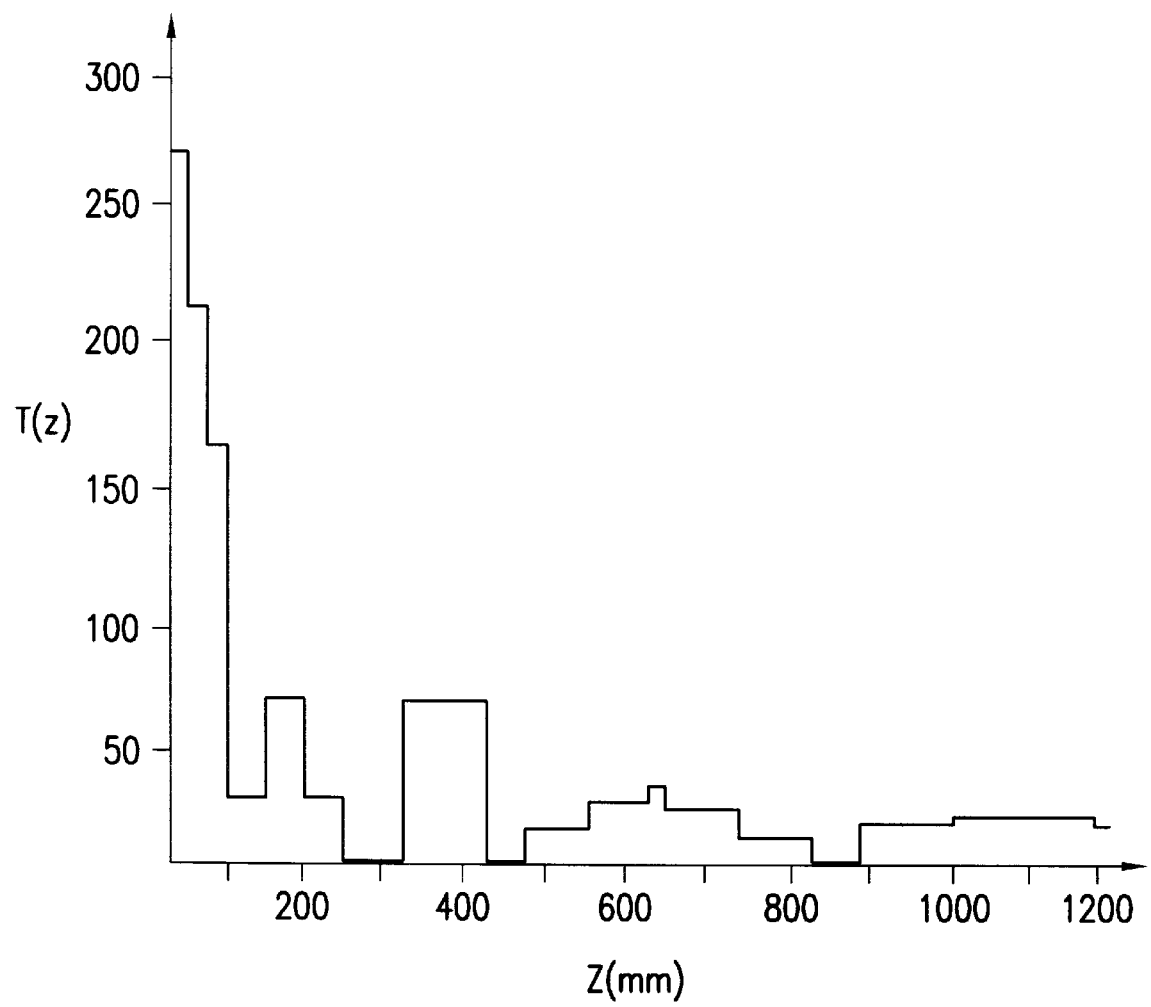
FIG. 12e is the turn distribution function T(z) of the magnet of FIG. 12b.
Figure 13A:
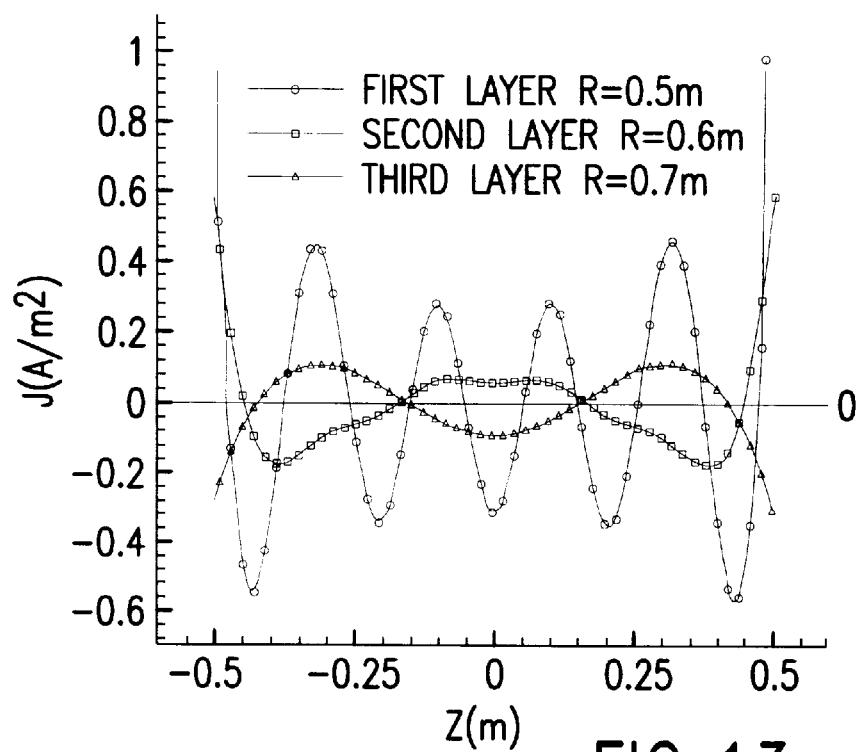
FIG. 13a shows current densities for a three layer symmetric magnet.
Figure 13C:
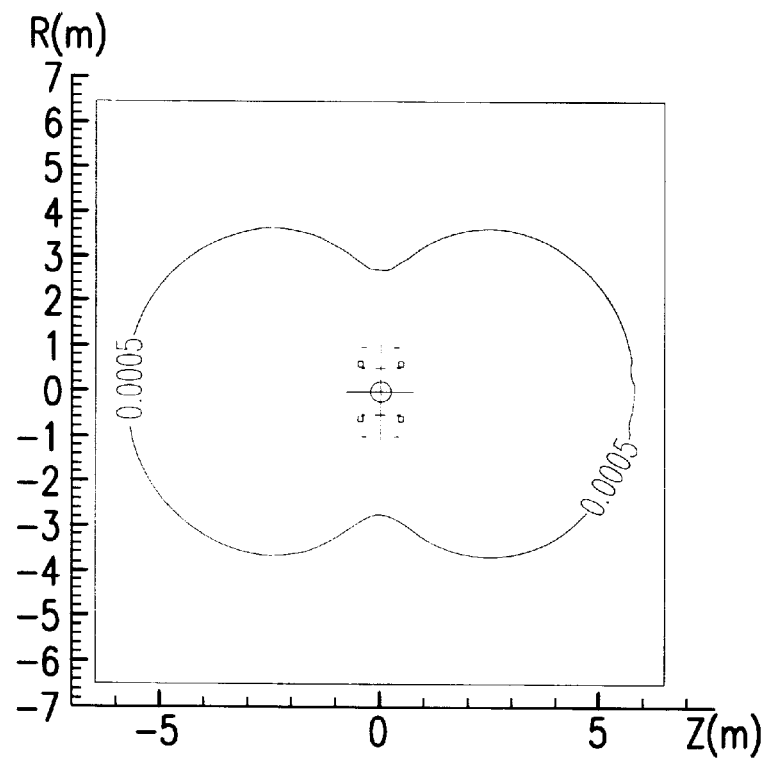
FIG. 13c shows the $5 \times 10^{-4}$ Tesla external stray field contour for the magnet of FIG. 13b.
Figure 13B:
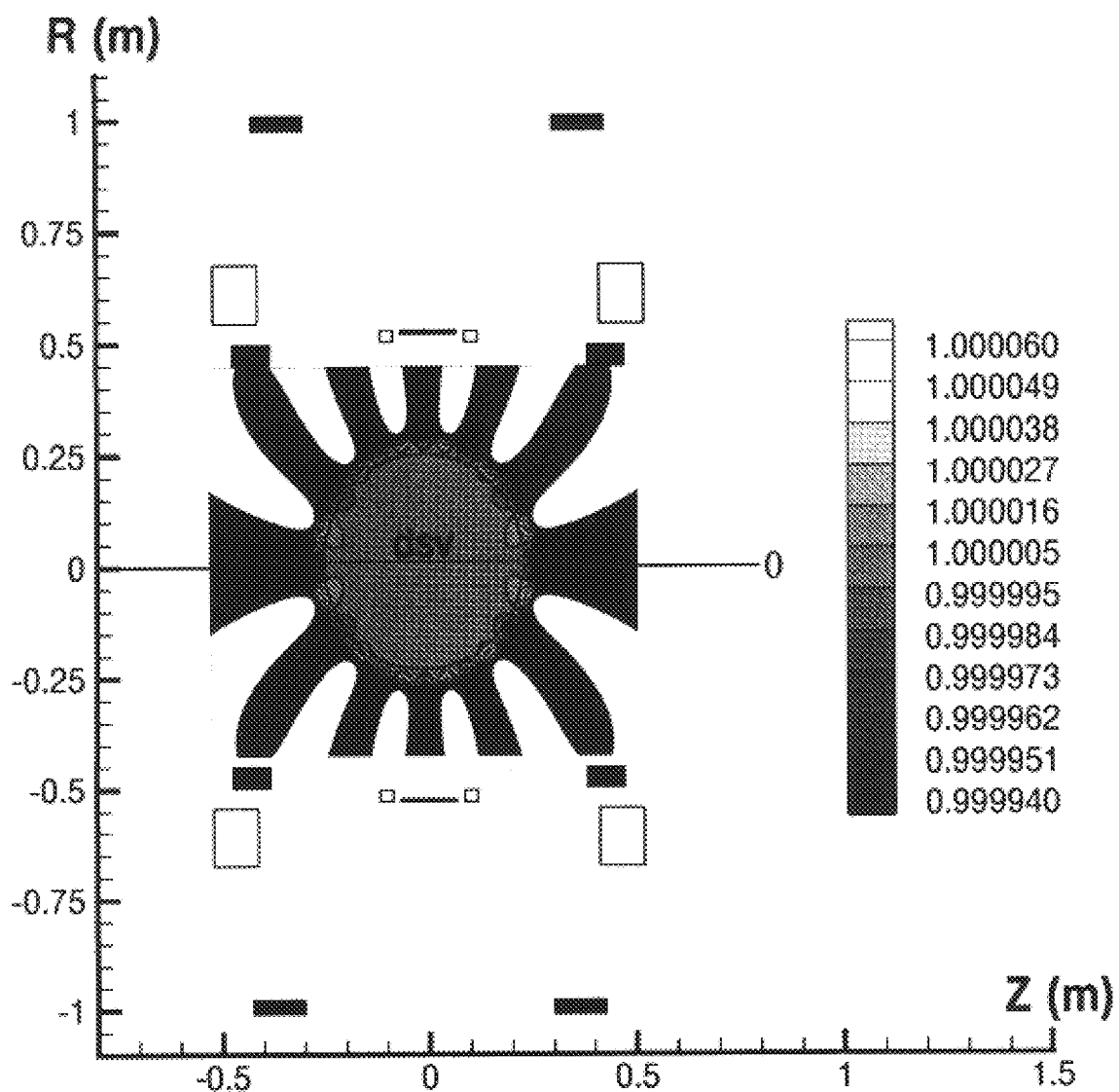
FIG. 13b is a plot showing field distribution and coil configuration for a magnet designed based on the current densities of FIG. 13a. Currents flowing in one direction are shown by filled blocks and currents flowing in the opposite direction are shown by open blocks.
Figure 13D:
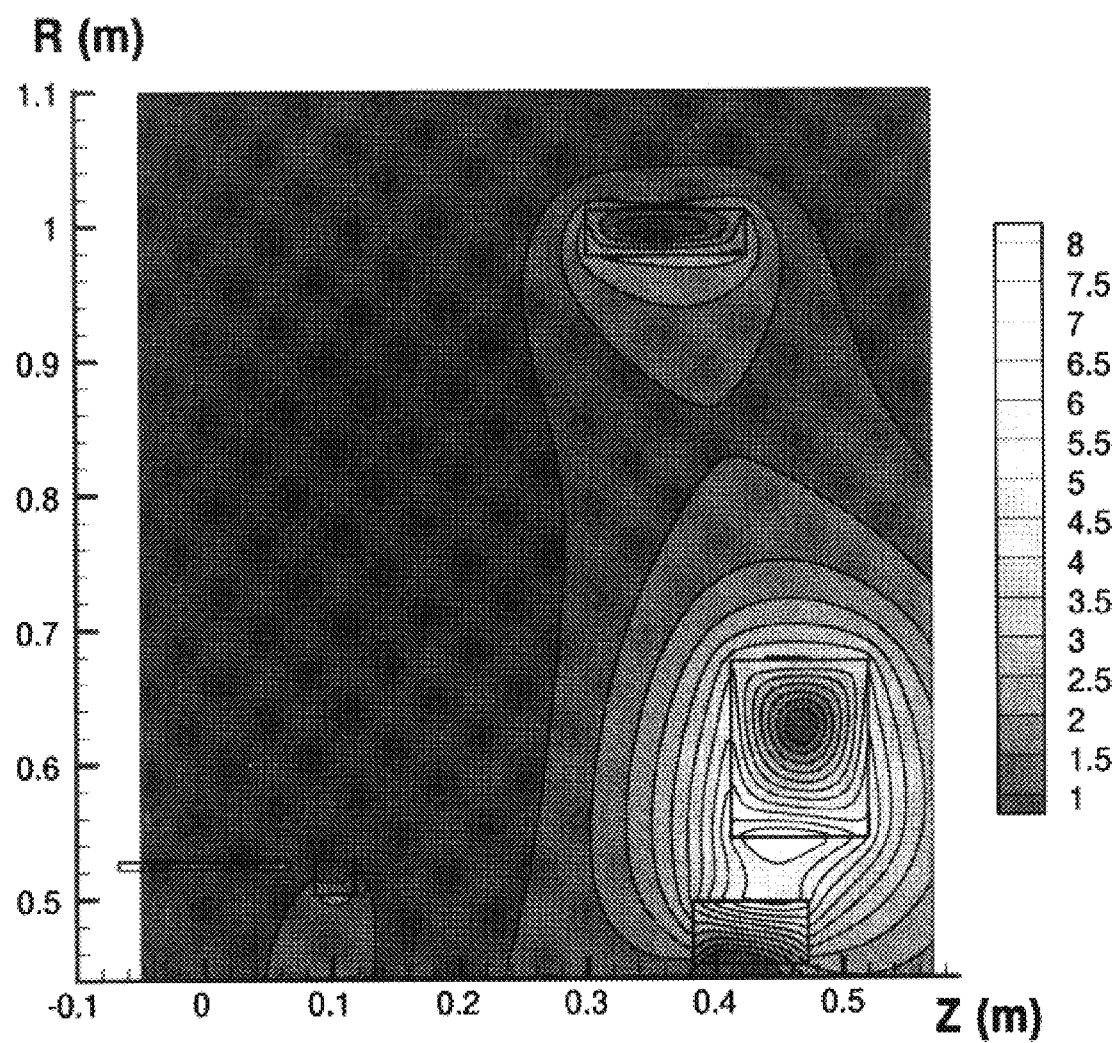
FIG. 13d shows the peak field distribution within the coils of the magnet of FIG. 13b.
Figure 14:
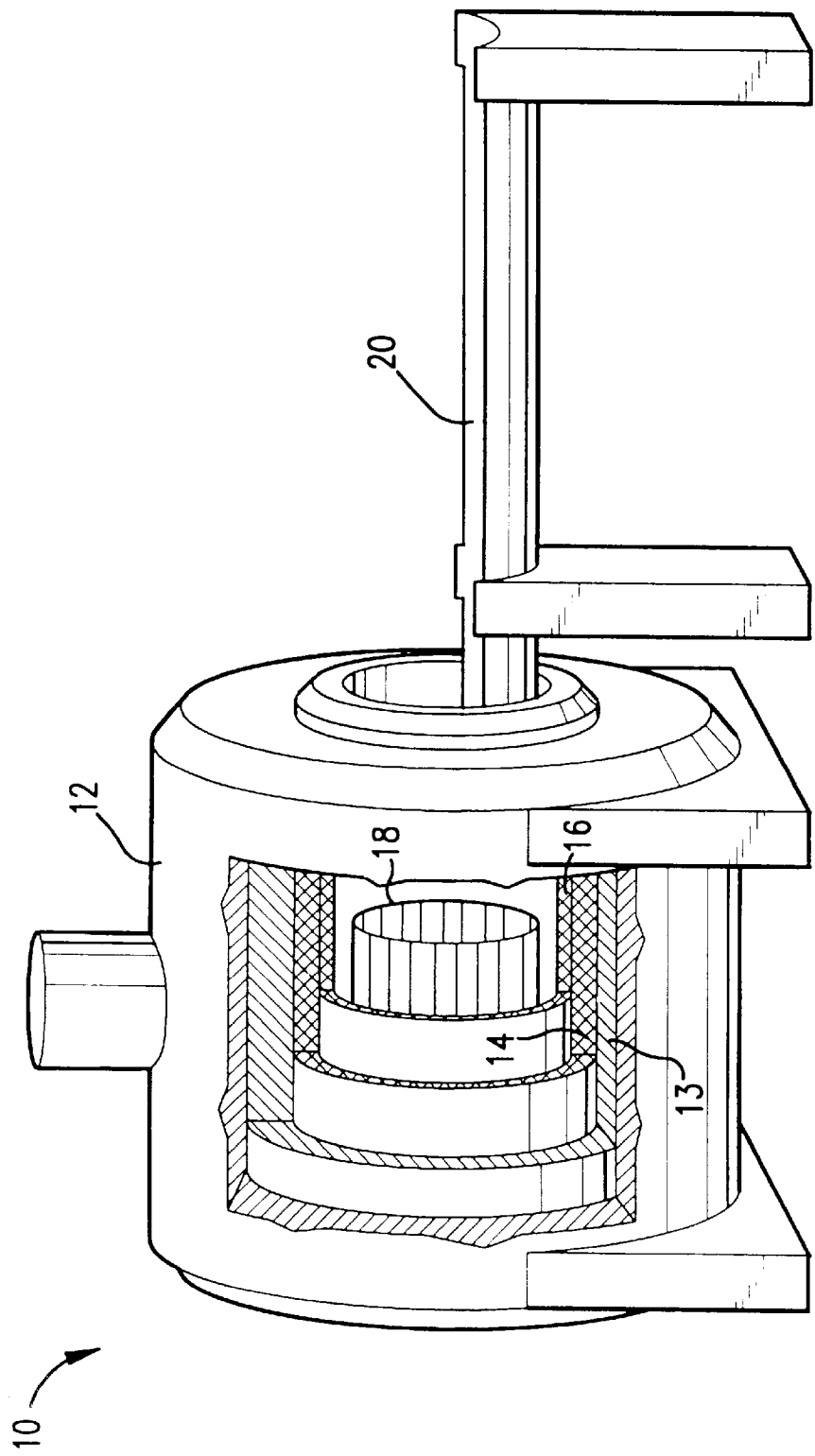
FIG. 14 is a schematic diagram of a prior art MRI machine.

Coil Configurations in Meters for Magnet of FIG. 12b

|  | R1 | R2 | Z1 | Z2 | J |
|---|---|---|---|---|---|
| Coil 1 | 0.6646 | 0.85753 | 0.0000 | 0.1097 | + |
| Coil 2 | 0.45 | 0.51786 | 0.0000 | 0.0571 | − |
| Coil 3 | 0.547 | 0.6266 | 0.00025 | 0.034 | + |
| Coil 4 | 0.50967 | 0.5587 | 0.173 | 0.2196 | − |
| Coil 5 | 0.5444 | 0.55299 | 0.317 | 0.424 | + |
| Coil 6 | 0.53824 | 0.5509 | 0.4776 | 0.6465 | + |
| Coil 7 | 0.5199 | 0.5293 | 0.6309 | 0.8407 | + |
| Coil 8 | 0.5088 | 0.5256 | 0.8869 | 1.210 | + |
| Coil 9 | 0.9823 | 1.0203 | 0.0043 | 0.2541 | − |
| Coil 10 | 0.888 | 0.913 | 0.550 | 0.7498 | − |
| Coil 11 | 0.7501 | 0.7526 | 1.000 | 1.199 | − |

What is claimed is:

1. A magnetic resonance system for producing MR images comprising an asymmetric superconducting magnet which produces a magnetic field which is substantially homogeneous over a predetermined region (the "dsv") whose diameter is greater than or equal to 40 centimeters, said magnet having a longitudinal axis and comprising a plurality of current carrying coils which surround the axis, are distributed along the axis, and define a turn distribution function T(z) which varies with distance z along the axis and is equal to the sum of the number of turns in all coils at longitudinal position z, wherein:

(i) the longitudinal extent of the plurality of coils defines first and second ends for the superconducting magnet, (ii) the variation of the longitudinal component of the magnetic field in the dsv is less than 20 parts per million peak-to-peak, (iii) the dsv defines a midpoint M which is closer to the first end than to the second end, (iv) the midpoint M of the dsv is spaced from the first end by a distance D which is less than or equal to 40 centimeters, and (v) the turn distribution function T(z) has a maximum value which occurs at a longitudinal location that is closer to the first end than to the second end.

2. The magnetic resonance system of claim 1 wherein the maximum of the turn distribution function T(z) occurs at the first end.

3. The magnetic resonance system of claim 1 wherein D is less than or equal to 35 centimeters.

4. The magnetic resonance system of claim 1 wherein the first and second ends are spaced apart by a distance L where:

$$0.3 \text{ meters} \leq L \leq 1.4 \text{ meters}.$$

5. The magnetic resonance system of claim 1 wherein the stray magnetic field external to the superconducting magnet is less than $5 \times 10^{-4}$ Tesla at all locations greater than 6 meters from the midpoint M of the dsv.

6. The magnetic resonance system of claim 1 wherein the peak magnetic field within any of the plurality of current carrying coils is less than 8.5 Tesla.

7. The magnetic resonance system of claim 1 wherein a plurality of radially-stacked coils are located at the first end with at least one of said coils being wound so as to carry current in a first direction and at least two of said coils being wound so as to carry current in a second direction, the second direction being opposite to the first direction.

8. The magnetic resonance system of claim 7 wherein the at least two coils which are wound to carry current in the second direction are located radially adjacent to one another.

9. The magnetic resonance system of claim 7 wherein the radially innermost and radially outermost coils of the plurality of coils are wound to carry current in the same direction.

10. A method for designing a superconducting magnet having a longitudinal axis which lies along the z-axis of a three dimensional coordinate system comprising:

(a) selecting at least one cylindrical surface for current flow, said surface being located at a radius r1 from the longitudinal axis and having a preselected length along said axis;

(b) selecting at least one constraint on the magnetic field produced by the superconducting magnet, said at least one constraint comprising the homogeneity of the magnetic field in the z-direction produced by the superconducting magnet over a predetermined region (the "dsv");

(c) obtaining a vector $J_{r1}(z)$ of current densities at the at least one cylindrical surface by solving the matrix equation:

$$AJ_{r1}(z) = B \qquad \text{(Equation I)}$$

where A is a matrix of unknown coefficients and B is a vector obtained by evaluating Biot-Savart integrals for each element of $J_{r1}(z)$ for the at least one constraint, said vector $J_{r1}(z)$ of current densities being obtained by:
  (i) transforming Equation I into a functional that can be solved using a preselected regularization technique, and
  (ii) solving the functional using said regularization technique;
(d) selecting an initial set of coil geometries for the superconducting magnet using the vector $J_{r1}(z)$ of current densities obtained in step (c); and
(e) determining final coil geometries for the superconducting magnet using a non-linear optimization technique applied to the initial set of coil geometries of step (d).

11. The method of claim 10 wherein the dsv has a diameter greater than or equal to 40 centimeters and the homogeneity of the magnetic field in the z-direction produced by the superconducting magnet is constrained to be better than 20 parts per million peak-to-peak over the dsv.

12. The method of claim 10 wherein the selected at least one cylindrical surface for current flow has a first end and a second end and the dsv is constrained to have a midpoint closer to the first end than to the second end.

13. The method of claim 10 wherein the at least one constraint comprises the peak magnetic field strength within the coils of the superconducting magnet.

14. The method of claim 10 wherein at least two cylindrical surfaces for current flow are selected in step (a).

15. The method of claim 10 comprising the additional step of displaying the final coil geometry determined in step (e).

16. The method of claim 10 comprising the additional step of producing a superconducting magnet having the final coil geometry determined in step (e).

17. An article of manufacture comprising a computer usable medium having computer readable code means embodied therein for designing a superconducting magnet in accordance with the method of claim 10.

18. Apparatus for designing a superconducting magnet comprising a programmed computer for performing the method of claim 10.

19. The method of claim 10 wherein the at least one constraint comprises specifying the magnitude of the stray magnet fields produced by the superconducting magnet at at least one location external to the superconducting magnet.

20. The method of claim 19 wherein the magnitude of the stray magnet fields produced by the superconducting magnet is specified along the surface of an ellipse external to the superconducting magnet.

* * * * *

UNITED STATES PATENT AND TRADEMARK OFFICE
CERTIFICATE OF CORRECTION

PATENT NO. : 6,140,900
DATED : October 31, 2000
INVENTOR(S) : Stuart Crozier, David M. Doddrell and Huawei Zhao It is certified that error appears in the above-identified patent and that said Letters Patent is hereby corrected as shown below:

<u>Title page, Item [54] and Column 1, line 1,</u>
Title, "ASSYMETRIC" should read -- ASYMMETRIC --

Signed and Sealed this

Seventeenth Day of December, 2002

JAMES E. ROGAN
*Director of the United States Patent and Trademark Office*